US012720679B2

(12) United States Patent
Coakley et al.

(10) Patent No.: US 12,720,679 B2
(45) Date of Patent: Aug. 25, 2026

(54) FLEXIBLE INTERCONNECT CIRCUITS COMPRISING WELDED CONNECTIONS

(71) Applicant: CelLink Corporation, San Carlos, CA (US)

(72) Inventors: Kevin Michael Coakley, Belmont, CA (US); Jean-Paul Ortiz, White Lake, MI (US); Malcolm Parker Brown, San Francisco, CA (US); Robin Gorrell, Georgetown, TX (US)

(73) Assignee: CelLink Corporation, San Carlos, CA (US)

( * ) Notice: Subject to any disclaimer, the term of this patent is extended or adjusted under 35 U.S.C. 154(b) by 0 days.

(21) Appl. No.: 19/410,133

(22) Filed: Dec. 5, 2025

(65) Prior Publication Data

US 2026/0164551 A1 Jun. 11, 2026

Related U.S. Application Data

(60) Provisional application No. 63/728,907, filed on Dec. 6, 2024.

(51) Int. Cl.
*H05K 1/11* (2006.01)
*H05K 1/02* (2006.01)
(Continued)

(52) U.S. Cl.
CPC ............. *H05K 1/111* (2013.01); *H05K 1/028* (2013.01); *H05K 1/181* (2013.01); *H05K 3/4007* (2013.01)

(58) Field of Classification Search
CPC .......... H05K 1/11; H05K 1/028; H05K 1/181; H05K 3/4007
(Continued)

(56) References Cited

U.S. PATENT DOCUMENTS 3,750,278 A 8/1973 Baker et al.
4,818,840 A 4/1989 Booth et al.
(Continued)

FOREIGN PATENT DOCUMENTS

CN 203715762 U 7/2014
EP 3496180 A1 6/2019
(Continued)

OTHER PUBLICATIONS

"Products—Contacting solutions for printed circuit boards," Powerelement.com, accessed Nov. 18, 2025, https://www.powerelement.com/en/products.
(Continued)

*Primary Examiner* — Andargie M Aychillhum
(74) *Attorney, Agent, or Firm* — Polygon IP, LLP

(57) ABSTRACT

Described herein are methods for forming welded connections to flexible interconnect circuits and assemblies comprising such connections. An assembly can include a flexible circuit and an electrical component subassembly. The flexible circuit may comprise a first insulating layer, a conductive layer, and a second insulating layer. The conductive layer may comprise aluminum and may be stacked between the first insulating layer and the second insulating layer. The electrical component subassembly may comprise an electrical component and an interconnecting structure. The electrical component may comprise a base, a contact pad comprising copper and stacked with the base, and a component opening extending through each of the base and the contact pad. The interconnecting structure may be stacked between the contact pad and the conductive layer. The interconnecting structure may be attached to the contact pad and be welded to the conductive layer by a weld plug.

19 Claims, 14 Drawing Sheets

(51) Int. Cl.
*H05K 1/181* (2026.01)
*H05K 3/40* (2006.01)

(58) Field of Classification Search
USPC .......................................................... 361/749
See application file for complete search history.

(56) References Cited

U.S. PATENT DOCUMENTS

| | | | |
|---|---|---|---|
| 5,262,594 | A | 11/1993 | Edwin et al. |
| 5,645,932 | A | 7/1997 | Uchibori |
| 6,010,771 | A | 1/2000 | Isen et al. |
| 6,036,809 | A | 3/2000 | Kelly et al. |
| 6,332,909 | B1 | 12/2001 | Teshima et al. |
| 6,787,732 | B1 | 9/2004 | Xuan et al. |
| 6,881,923 | B2 | 4/2005 | Battaglia |
| 6,992,001 | B1 | 1/2006 | Lin |
| 7,497,004 | B2 | 3/2009 | Cote et al. |
| 7,633,035 | B2 | 12/2009 | Kirmeier |
| 8,510,934 | B2 | 8/2013 | Brand et al. |
| 8,931,166 | B2 | 1/2015 | Marttila |
| 9,214,607 | B1 | 12/2015 | Andrews |
| 9,671,352 | B2 | 6/2017 | Woo et al. |
| 9,692,030 | B2 | 6/2017 | Schüssler et al. |
| 9,730,333 | B2 | 8/2017 | Li et al. |
| 10,008,403 | B2 | 6/2018 | Rumsby et al. |
| 10,842,025 | B1 | 11/2020 | Lane |
| 2001/0006766 | A1 | 7/2001 | O'Brien et al. |
| 2002/0046856 | A1 | 4/2002 | Alcoe |
| 2002/0050489 | A1 | 5/2002 | Ikegami et al. |
| 2003/0062347 | A1 | 4/2003 | Song et al. |
| 2006/0032665 | A1 | 2/2006 | Ice |
| 2007/0114057 | A1 | 5/2007 | Matsuda |
| 2007/0171129 | A1 | 7/2007 | Coleman et al. |
| 2007/0193027 | A1 | 8/2007 | Takakusaki et al. |
| 2008/0017971 | A1 | 1/2008 | Hollis |
| 2008/0083715 | A1 | 4/2008 | Kirmeier |
| 2008/0128397 | A1 | 6/2008 | Gandhi |
| 2009/0007421 | A1 | 1/2009 | Chen et al. |
| 2010/0031996 | A1 | 2/2010 | Basol |
| 2011/0001670 | A1 | 1/2011 | Coleman et al. |
| 2011/0089212 | A1 | 4/2011 | Schmid et al. |
| 2012/0164490 | A1 | 6/2012 | Itoi et al. |
| 2012/0171527 | A1 | 7/2012 | Hiroma |
| 2012/0227907 | A1 | 9/2012 | Arakawa et al. |
| 2013/0055555 | A1 | 3/2013 | Forster et al. |
| 2013/0260191 | A1 | 10/2013 | Takahashi et al. |
| 2014/0268780 | A1 | 9/2014 | Wang et al. |
| 2015/0023584 | A1 | 1/2015 | Rudin |
| 2015/0228956 | A1 | 8/2015 | Schüssler et al. |
| 2015/0270190 | A1 | 9/2015 | Kim et al. |
| 2016/0181579 | A1 | 6/2016 | Geshi et al. |
| 2016/0207287 | A1 | 7/2016 | Kim |
| 2016/0315304 | A1 | 10/2016 | Biskup |
| 2016/0366768 | A1 | 12/2016 | Matsuda |
| 2017/0012331 | A1 | 1/2017 | Ng et al. |
| 2017/0214033 | A1 | 7/2017 | Takano et al. |
| 2018/0034023 | A1 | 2/2018 | Newman et al. |
| 2018/0205048 | A1 | 7/2018 | Enomoto et al. |
| 2018/0294536 | A1 | 10/2018 | Kruszelnicki |
| 2019/0097204 | A1 | 3/2019 | Liposky et al. |
| 2019/0181419 | A1 | 6/2019 | Suba et al. |
| 2019/0228985 | A1* | 7/2019 | Hu ...................... H10W 76/138 |
| 2019/0296281 | A1 | 9/2019 | Elsberry |
| 2019/0312251 | A1 | 10/2019 | Matthews |
| 2019/0341585 | A1 | 11/2019 | Shi et al. |
| 2020/0053875 | A1* | 2/2020 | Holec .................. H05K 1/0298 |
| 2020/0220120 | A1 | 7/2020 | Day et al. |
| 2021/0028140 | A1 | 1/2021 | Loy et al. |
| 2021/0066683 | A1 | 3/2021 | Lane |
| 2021/0086306 | A1 | 3/2021 | Lane |
| 2021/0091363 | A1 | 3/2021 | Lane |
| 2021/0092837 | A1 | 3/2021 | Lane |
| 2021/0092851 | A1 | 3/2021 | Lane |
| 2021/0092853 | A1 | 3/2021 | Lane |
| 2021/0092854 | A1 | 3/2021 | Lane |
| 2022/0173025 | A1 | 6/2022 | Lee et al. |
| 2023/0402776 | A1 | 12/2023 | Coakley et al. |

FOREIGN PATENT DOCUMENTS

| | | | |
|---|---|---|---|
| KR | 20120025182 | A | 3/2012 |
| KR | 20150058939 | A | 5/2015 |
| WO | 2019150740 | A1 | 8/2019 |

OTHER PUBLICATIONS

Nagarajan Palavesam et al; "Roll-to-roll processing of film substrates for hybrid integrated flexible electronics" Flexible and Printed Electronics, Feb. 2018.

International Application Serial No. PCT/US25/58281, Search Report and Written Opinion mailed Apr. 14, 2026, 10 pgs.

* cited by examiner

Top View

*Side Cross-Sectional View*

*Bottom View*

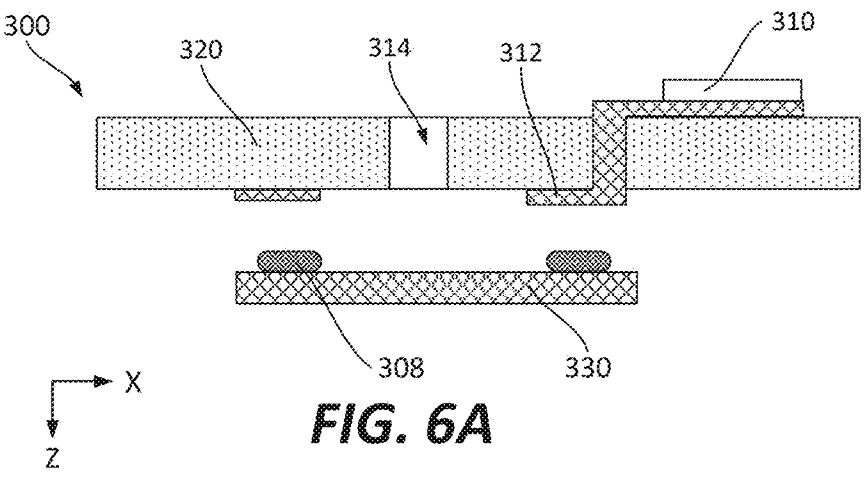
FIG. 6A
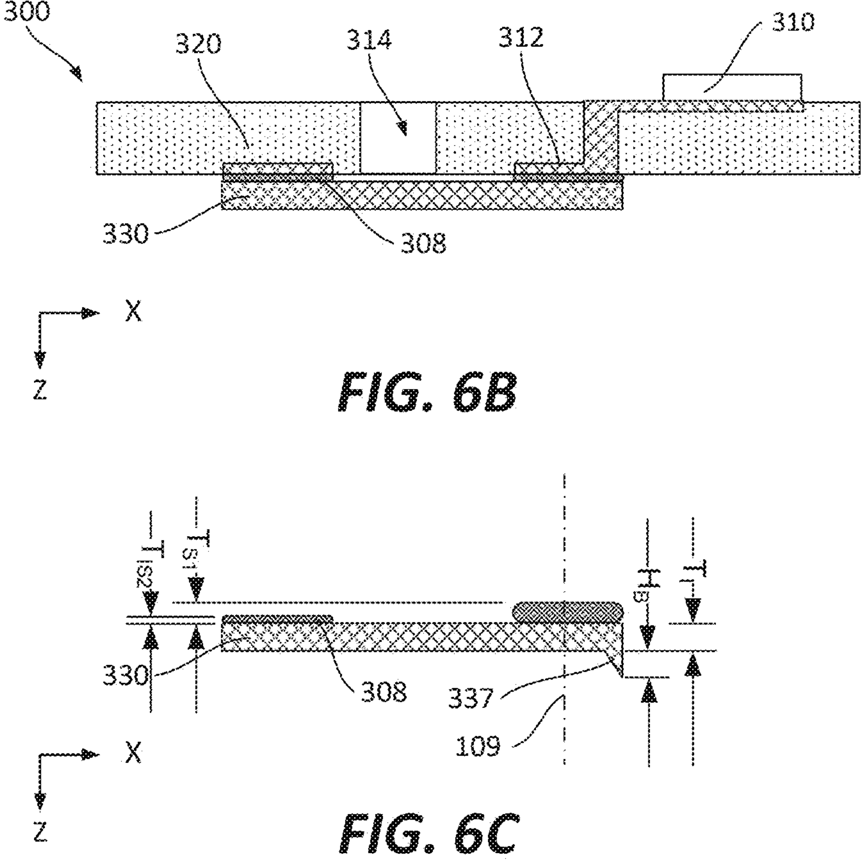
FIG. 6B
FIG. 6C

*During Welding*

FLEXIBLE INTERCONNECT CIRCUITS COMPRISING WELDED CONNECTIONS

CROSS-REFERENCE TO RELATED APPLICATIONS

This application claims the benefit under 35 U.S.C. § 119(e) of U.S. Provisional Patent Application 63/728,907 by Kevin Coakley, titled: “Flexible Interconnect Circuits Comprising Welded Connections”, filed on 2024 Dec. 6, which is incorporated herein by reference in its entirety for all purposes.

FIELD OF TECHNOLOGY

This patent application relates generally to the field of electrical interconnection technology, and more specifically to welded electrical connections between flexible interconnect circuits and electrical component subassemblies.

BACKGROUND

Battery cells in battery packs and other types of battery assemblies are typically interconnected using individual busbars. Each busbar is stamped from a sufficiently thick metal sheet (selected based on current ratings) and individually handled during the busbar installation (e.g., positioned over and welded to the battery terminals). Furthermore, additional circuits and electrical devices (e.g., voltage sense harnesses) can be installed and connected to these busbars during the battery pack fabrication. Overall, many different operations and components are used, which complicates the fabrication process.

Flexible circuits are increasingly used in such systems because they offer reduced mass, improved routing flexibility, and compatibility with high-density architectures. However, forming reliable electrical and mechanical connections between flexible circuits and a wide variety of electrical components remains challenging.

In many existing approaches, electrical components are connected to flexible circuits by soldering to copper traces. While effective in some applications, soldering copper-based components directly to aluminum-based conductors typically found in flexible circuits presents significant challenges. Aluminum is difficult to solder reliably, and attempts to join copper components to aluminum traces often require nickel plating, special fluxes, or multi-step processing. These added steps increase manufacturing complexity, cost, and assembly time, and can introduce reliability issues, especially in environments subject to vibration, thermal cycling, or mechanical flexing.

What is needed are new circuit types, such as multilayered flexible interconnect circuits, that overcome various challenges associated with conventional busbars.

SUMMARY

Described herein are methods for forming welded connections to flexible interconnect circuits and assemblies comprising such connections. An assembly can include a flexible circuit and an electrical component subassembly. The flexible circuit may comprise a first insulating layer, a conductive layer, and a second insulating layer. The conductive layer may comprise aluminum and may be stacked between the first insulating layer and the second insulating layer. The electrical component subassembly may comprise an electrical component and an interconnecting structure. The electrical component may comprise a base, a contact pad comprising copper and stacked with the base, and a component opening extending through each of the base and the contact pad. The interconnecting structure may be stacked between the contact pad and the conductive layer. The interconnecting structure may be attached to the contact pad and be welded to the conductive layer by a weld plug.

Clause 1. A flexible circuit assembly comprising: a flexible circuit comprising a first insulating layer, a conductive layer, and a second insulating layer, wherein: the conductive layer comprises aluminum and is stacked between the first insulating layer and the second insulating layer along a stacking axis, and the first insulating layer comprises a first-layer opening; and an electrical component subassembly comprising an electrical component and an interconnecting structure, wherein: the electrical component comprises a base, a contact pad comprising copper and stacked with the base, and a component opening, extending through each of the base and the contact pad, the component opening comprises a largest cross-sectional dimension, perpendicular to the stacking axis, fully overlapping with the interconnecting structure, the interconnecting structure is stacked between the contact pad and the conductive layer along the stacking axis and comprises one or more materials selected from the group consisting of nickel, brass, and copper, and the interconnecting structure is attached to the contact pad and is welded to the conductive layer by a weld plug such that the weld plug overlaps with the component opening.

Clause 2. The flexible circuit assembly of clause 1, wherein the weld plug is formed by one or more of a laser weld, an ultrasonic weld, and a resistance weld.

Clause 3. The flexible circuit assembly of clause 1, wherein the interconnecting structure is attached to the contact pad using one or more of a solder patch, an additional weld plug, a press fit pin, and a screw-connector.

Clause 4. The flexible circuit assembly of clause 1, wherein: the interconnecting structure comprises an interconnecting protrusion, the base comprises a connecting opening with the contact pad extending into the connecting opening, and the interconnecting protrusion is press-fit into the connecting opening directly interfacing and pressed against the contact pad within the connecting opening.

Clause 5. The flexible circuit assembly of clause 1, wherein the electrical component is selected from the group consisting of a printed circuit board, a surface mount electronic device, a voltage sensor, a voltage-sense harness, a negative thermal coefficient thermistor, a resistor, a capacitor, a diode, a transistor, an inductor, a transformer, an optoelectronic device, a sensor, a switch, an oscillator, an integrated circuit, another flexible interconnect circuit, and a power supply.

Clause 6. The flexible circuit assembly of clause 1, wherein: the electrical component is a printed circuit board, and the base comprises a glass-reinforced epoxy laminate material.

Clause 7. The flexible circuit assembly of clause 1, wherein the largest cross-sectional dimension of the component opening is less than 5 millimeters.

Clause 8. The flexible circuit assembly of clause 1, wherein the interconnecting structure has a uniform composition through an entire volume of the interconnecting structure.

Clause 9. The flexible circuit assembly of clause 1, wherein the interconnecting structure comprises a first surface and a second surface having a different composition than the first surface.

Clause 10. The flexible circuit assembly of clause 1, wherein the interconnecting structure is a clad.

Clause 11. The flexible circuit assembly of clause 1, wherein the interconnecting structure is substantially planar such that an out-of-plane deviation of the interconnecting structure, at least between the weld plug and one or more attachment points between the interconnecting structure and the contact pad, is less than 100 micrometers.

Clause 12. The flexible circuit assembly of clause 1, wherein the interconnecting structure is thinner than the conductive layer along the stacking axis.

Clause 13. The flexible circuit assembly of clause 1, wherein the interconnecting structure has a thickness of 50-200 micrometers.

Clause 14. The flexible circuit assembly of clause 1, wherein the conductive layer has a thickness of at least 300 micrometers.

Clause 15. The flexible circuit assembly of clause 1, wherein the weld plug terminates in the conductive layer to a surface of the conductive layer facing the second insulating layer.

Clause 16. The flexible circuit assembly of clause 1, wherein the electrical component subassembly further comprises a bonding layer, positioned between and bonding the electrical component and the first insulating layer.

Clause 17. The flexible circuit assembly of clause 1, wherein the component opening is unfilled, thereby exposing the weld plug and a portion of the interconnecting structure surrounding the weld plug.

Clause 18. The flexible circuit assembly of clause 1, wherein the second insulating layer comprises a second-layer opening aligned with the first-layer opening and the weld plug along the stacking axis.

Clause 19. The flexible circuit assembly of clause 18, wherein the second-layer opening is unfilled, exposing a portion of the conductive layer.

Clause 20. The flexible circuit assembly of clause 1, wherein a portion of the interconnecting structure protrudes from between the electrical component and the flexible circuit.

Clause 21. The flexible circuit assembly of clause 1, wherein the flexible circuit further comprises an additional conductive layer stacked between the conductive layer and the second insulating layer along the stacking axis.

Clause 22. The flexible circuit assembly of clause 21, wherein the additional conductive layer directly interfaces the conductive layer.

Clause 23. The flexible circuit assembly of clause 1, wherein: the flexible circuit further comprises a third insulating layer and an electromagnetic shield stacked between the second insulating layer and the third insulating layer along the stacking axis, and the second insulating layer is stacked between the conductive layer and the electromagnetic shield along the stacking axis.

Clause 24. The flexible circuit assembly of clause 1, wherein at least one of the first insulating layer and the second insulating layer comprises polypropylene.

Clause 25. A method of fabricating a flexible circuit assembly comprising a stacking axis, the method comprising: providing an electrical component subassembly comprising an electrical component and an interconnecting structure, wherein: the electrical component comprises a base, a contact pad comprising copper and stacked with the base, and a component opening, extending through each of the base and the contact pad, the component opening comprises a largest cross-sectional dimension, perpendicular to the stacking axis, fully overlapping with the interconnecting structure, and the interconnecting structure is soldered to the contact pad by a solder patch and comprises one or more materials selected from the group consisting of nickel, brass, and copper; aligning a flexible circuit with the electrical component subassembly, wherein: the flexible circuit comprises a first insulating layer, a conductive layer, and a second insulating layer, the conductive layer comprises aluminum and is stacked between the first insulating layer and the second insulating layer along a stacking axis, and the first insulating layer comprises a first-layer opening; pressing the conductive layer against the interconnecting structure, wherein: the interconnecting structure is stacked between the contact pad and the conductive layer along the stacking axis, and at least a portion of the interconnecting structure, which is aligned with the electrical component, directly interfaces the conductive layer; and welding the conductive layer against the interconnecting structure through the component opening.

Clause 26. The method of clause 25, wherein pressing the conductive layer against the interconnecting structure comprises: contacting the base with a first set of clamps, contacting the flexible circuit with a second set of clamps, and advancing the first set of clamps and the second set of clamps toward one another.

Clause 27. The method of clause 26, wherein: the first set of clamps does not contact the interconnecting structure, and at least the base is stacked between the first set of clamps and the interconnecting structure.

Clause 28. The method of clause 27, wherein the first set of clamps is positioned proximate to the component opening without protruding into the component opening.

Clause 29. The method of clause 26, wherein the second set of clamps directly interfaces the conductive layer.

These and other embodiments are described further below with reference to the figures.

BRIEF DESCRIPTION OF THE DRAWINGS

The included drawings are for illustrative purposes and serve only to provide examples of possible structures and operations for the disclosed inventive systems, apparatus, and methods. These drawings in no way limit any changes in form and detail that may be made by one skilled in the art without departing from the spirit and scope of the disclosed implementations.

FIG. 6A is a schematic cross-sectional side view of a subassembly comprising an electrical component and a contact pad, as well as an interconnecting structure, after alignment of the electrical component with the interconnecting structure but prior to soldering, in accordance with some examples.

FIG. 6B is a schematic cross-sectional side view of the subassembly of FIG. 6A after soldering the interconnecting structure to the contact pad, in accordance with some examples.

FIG. 6C is a schematic cross-sectional side view of an interconnecting structure comprising a burr, in accordance with some examples.

DETAILED DESCRIPTION

Introduction

Figure 1A:
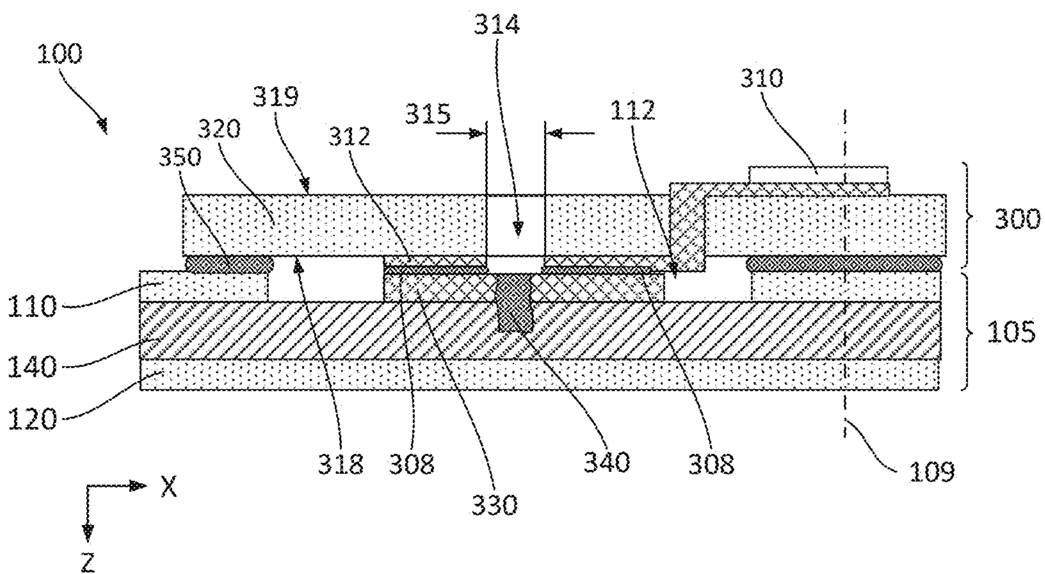
FIG. 1A is a schematic cross-sectional side view of a flexible circuit assembly, in accordance with some examples.

In the following description, numerous specific details are outlined to provide a thorough understanding of the presented concepts. In some examples, the presented concepts are practiced without some or all of these specific details. In other examples, well-known process operations have not been described in detail to unnecessarily obscure the described concepts. While some concepts will be described in conjunction with specific examples, it will be understood that these examples are not intended to be limiting.

Flexible interconnect circuits are used to deliver power and/or signals and are used for various applications, such as vehicles, appliances, electronics, and the like. One example of such flexible interconnect circuits is a harness or, more specifically, a voltage-sense harness. Another example is a battery interconnect circuit (e.g., operable as bus bars). Conventional harnesses use sets of stranded round wires. A separate polymer shell insulates each wire, adding to the size and weight of the harness.

Unlike conventional harnesses, flexible interconnect circuits described herein have thin flat profiles, enabled by thin conductive layers that can be positioned side-by-side. Flexible interconnect circuits may include one or more conductive layers disposed between insulating layers. Each conductive layer can have a flat rectangular profile. Furthermore, unlike conventional bus bars, flexible interconnect circuits can provide additional functionality, such as in-situ insulators, integrated fusible links, and the like. These flexible interconnect circuits may interface discrete electrical components, such as sensors, integrated circuits, or power modules. Electrical components may include, for example, individual electronic components such as temperature sensors or fusing elements, printed circuit board assemblies (PCBAs) with a few electronic components, or larger and more complex PCBAs. Mechanically and electrically robust joints between the flexible interconnect circuits and discrete electrical components are required in many applications.

In some examples, conductive layers are formed from the same metal sheet (e.g., foil). For purposes of this disclosure, the term "interconnect" is used interchangeably with "interconnect circuit", the term "conductive layer" with "conductor" or "conductor layer", and the term "insulating layer" with "insulator".

Conventional interconnection techniques, including soldering, adhesive bonding, and mechanical fastening, can present limitations when employed with dissimilar conductive materials, such as aluminum conductors in flexible interconnect circuits and copper contact pads in component subassemblies. Differences in melting temperature, thermal expansion coefficients, and thermal conductivity between aluminum and copper can result in inadequate mechanical strength. As a result, achieving a reliable, low-resistance, and durable electrical connection between aluminum- and copper-based elements remains a persistent challenge in the industry.

Accordingly, there exists a need for improved methods and structures for forming welded electrical connections between flexible circuits and component subassemblies that overcome the limitations of conventional joining techniques. The present disclosure addresses these and other needs by providing welded interconnect assemblies incorporating interconnecting structures and weld plugs configured to establish robust electrical and mechanical coupling between aluminum conductive layers and copper contact pads.

Typically, to connect electrical components to flexible circuits having conductive traces made from chemically etched copper, nickel tabs are soldered to the copper traces. The copper traces are typically too thin for reliably welding components directly to them. Often, nickel tabs are soldered to the copper traces in the first step of a two-step process. Second, electrical components are typically then soldered to the soldered-on nickel tabs.

Advantageously, the thicker Al or Cu conductors in some flexible interconnect circuits allows laser welding directly to other components without soldering an intervening nickel tab to the flexible interconnect circuit. Instead, an interconnecting structure may be included in, for example, a PCBA. The PCBA may then be directly welded to the flexible circuit. Eliminating a manufacturing step in the process of attaching electrical components to flexible interconnect circuits may be desirable by lowering costs associated with both labor and component costs.

Interconnecting structures integrated into PCBAs provide weldable material on the PCBA, which also often utilize thin copper traces for conductivity between components. Laser welding directly to thin copper traces is not reliable. Welds penetrate through the depth of the thin copper trace, making the resulting weld mechanically weak.

Described herein are flexible circuit assemblies comprising flexible circuits and electrical component subassemblies. Interconnecting structures connected to the electrical component subassemblies make the electrical component subassemblies highly weldable to the conductive layers of the flexible circuits. Also described are methods for fabricating flexible circuit assemblies with a single welding step connecting electrical component subassemblies comprising interconnecting structures to the conductive layers.

FIGS. 1A-G and 2A-B: Examples of Flexible Circuit Assemblies

FIG. 1A is a schematic cross-sectional side view of a flexible circuit assembly 100, in accordance with some examples. The flexible circuit assembly 100 comprises a flexible circuit 105 and an electrical component subassembly 300. The flexible circuit 105 comprises a first insulating layer 110, a conductive layer 140, and a second insulating layer 120. The flexible circuit assembly 100 comprises a stacking axis 109. The conductive layer 140 comprises aluminum and is stacked between the first insulating layer 110 and the second insulating layer 120 along the stacking axis 109. In some examples, conductive layer 140, as well as other traces (if present), have a uniform thickness throughout the entire circuit boundary. For example, conductive layer 140, as well as other traces, can be formed from the same sheet of metal (even when these traces are disjoined). In some examples, the conductive layer 140 has a thickness of at least 100 micrometers, at least 200 micrometers, at least 400 micrometers, or even at least 600 micrometers. In some examples, the conductive layer 140, or another trace (if present), may comprise rolled metal foil. In contrast to the vertical grain structure associated with electrodeposited foil and/or plated metal, the horizontally elongated grain structure of rolled metal foil may help increase the resistance to crack propagation in conductive elements under cyclical loading conditions. This may help increase the fatigue life of flexible circuit 105.

The first insulating layer 110 comprises a first-layer opening 112. First insulating layer 110 and second insulating layer 120 may include (or be formed from) polyimide (PI), polyethylene naphthalate (PEN), polyethylene terephthalate (PET), polymethyl methacrylate (PMMA), ethyl vinyl acetate (EVA), polyethylene (PE), polyvinyl fluoride (PVF), polyamide (PA), and/or polyvinyl butyral (PVB).

The thickness of one or both of first insulating layer 110 and second insulating layer 120 may be between 1 micrometer and 500 micrometers or, more specifically, between 10 micrometers and 125 micrometers, or even between 50 micrometers and 100 micrometers. The conductive layer 140 is adhered to the first insulating layer 110 and the second insulating layer 120. In some examples, each of first insulating layer 110 and second insulating layer 120 includes an adhesive sublayer facing conductive traces, e.g., for lamination to conductive traces and also to each other. These adhesive sublayers may also be used for directly laminating first insulating layer 110 and second insulating layer 120 (beyond the conductive layer boundaries), e.g., for edge sealing of flexible circuit 105. In some examples, the surface of first insulating layer 110 and/or second insulating layer 120 (e.g., the surface facing away from conductive traces) comprises an adhesive sublayer for bonding this insulating layer to an external structure (e.g., a supporting panel). First insulating layer 110 and second insulating layer 120 provide the electrical isolation and mechanical support to conductive traces. In some examples, at least one of the first insulating layer 110 and the second insulating layer 120 comprises polypropylene. In some examples, the first insulating layer 110 comprises a different polymer than the second insulating layer 120. In some examples, first insulating layer 110 and second insulating layer 120 may initially be processed in a sheet or roll form and may subsequently be laminated to the conductive layer using, for example, adhesive material.

The electrical component subassembly 300 comprises an electrical component 310 and an interconnecting structure 330. The electrical component 310 comprises a base 320, a contact pad 312, and a component opening 314. The contact pad 312 comprises copper and is stacked with the base 320. In some examples, the base 320 is formed from an electrically insulating material. For example, the base 320 may be formed from a glass fiber reinforced epoxy or polymer resin. The component opening 314 extends through each of the base 320 and the contact pad 312. In some examples, the base 320 comprises a first base side 319 and a second base side 318 opposite the first base side 319, and the component opening 314 extends between the second base side 318 and the first base side 319. The component opening 314 comprises a largest cross-sectional dimension 315. The largest cross-sectional dimension 315 is perpendicular to the stacking axis 109 and fully overlaps with the interconnecting structure 330. The interconnecting structure 330 is stacked between the contact pad 312 and the conductive layer 140 along the stacking axis 109. The interconnecting structure 330 comprises one or more materials selected from the group consisting of nickel, brass, and copper. The interconnecting structure 330 is attached to the contact pad 312. In some examples, the interconnecting structure 330 is attached to the contact pad 312 using one or more of a solder patch 308, an additional weld plug, a press fit pin, and a screw-connector. In some examples, the largest cross-sectional dimension 315 of the component opening 314 is less than 15 millimeters, less than 10 millimeters, less than 8 millimeters, less than 4 millimeters, less than 2 millimeters, or even less than 1 millimeter. Specifically, in some examples, the largest cross-sectional dimension 315 of the component opening 314 is less than 5 millimeters.

The interconnecting structure 330 is welded to the conductive layer 140 by a weld plug 340 such that the weld plug 340 overlaps with the component opening 314. In some examples, the weld plug 340 is formed by one or more of a laser weld, an ultrasonic weld, or a resistance weld. While one weld plug 340 is shown in the example of FIG. 1A, two, three, four, or even more than four weld plugs 340 may be formed between the subassembly 300 and the conductive layer 140.

In some examples, the interconnecting structure 330 is substantially planar. In other words, an out-of-plane deviation of the interconnecting structure 330, at least between the weld plug 340 and one or more attachment points between the interconnecting structure 330 and the contact pad 312, is less than 500 micrometers, less than 300 micrometers, less than 100 micrometers, or even less than 50 micrometers. An out-of-plane deviation may be caused, for example, by a burr extending from a surface of the interconnecting structure 330. A burr may remain on a surface of the interconnecting structure 330 after manufacturing of the interconnecting structure 330. An out-of-plane deviation may also be caused by an out-of-plane bend in the interconnecting structure 330. Excessive roughness of the surface of the interconnecting structure 330 facing the conductive layer 140 may also cause an out-of-plane deviation. The larger the out-of-plane deviation, the more likely an air gap will exist within the weld plug 340 at the intersection of the interconnecting structure 330 and the conductive layer 140. This is because a larger out-of-plane deviation is less likely to be flattened against the surface of the conductive layer 140 during pressing of the conductive layer 140 against the interconnecting structure 330, as will be described below. An air gap is not desirable because it decreases both the mechanical strength and the electrical conductivity of the weld joint.

Figure 1B:
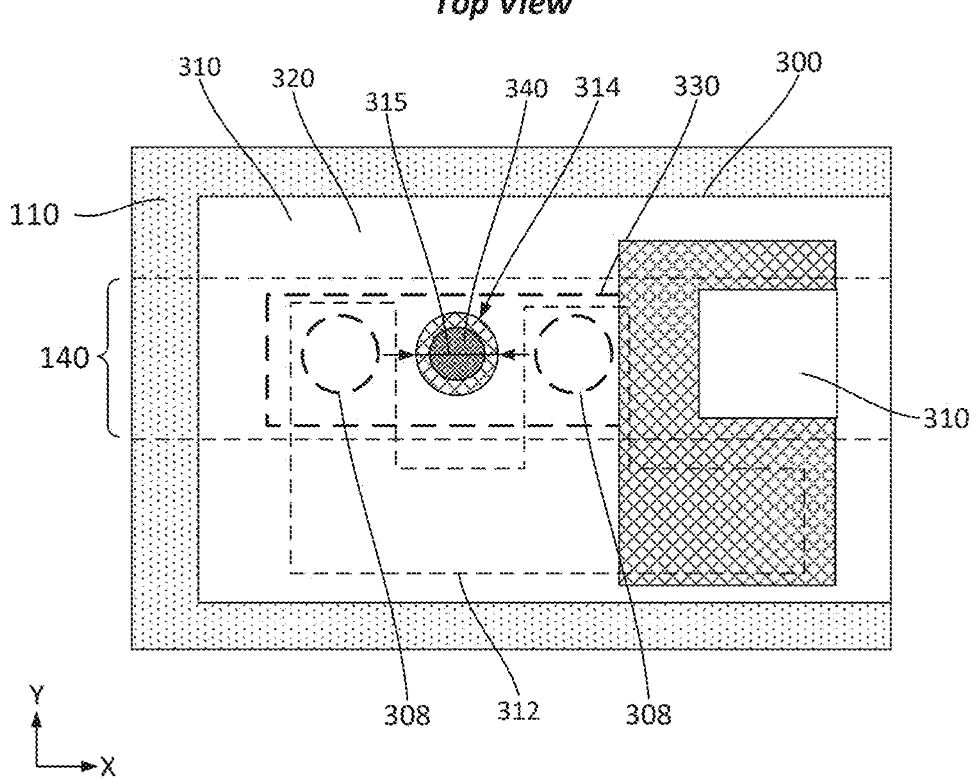
FIG. 1B is a schematic top view of the flexible circuit assembly of FIG. 1A, in accordance with some examples.

FIG. 1B is a schematic top view of the flexible circuit assembly 100 of FIG. 1A, in accordance with some examples. In the example of FIG. 1B, the weld plug 340 has a cross-sectional shape projected on a plane perpendicular to the stacking axis 109 that is a circle. Other cross-sectional shapes are within the scope. For example, the cross-sectional shape may be a square, an oval, or a line. An example of relative positions of solder patches 308, the contact pad 312, and the component opening 314 is shown in the example of FIG. 1B, with solder patches 308 and the contact pad 312 indicated in dashed lines. In the example of FIG. 1B, the solder patches 308 project a shape in a plane perpendicular to the stacking axis 109 that does not overlap with a shape projected by the component opening 314 in a plane parallel with the plane of the shape projected by the solder patches 308. In some examples, one or more solder patches 308 project a shape in a plane perpendicular to the stacking axis 109 that at least partially overlaps with a shape projected by the component opening 314 in a plane parallel with the plane of the shape projected by the solder patch 308.

Returning to FIG. 1A, in some examples, the electrical component subassembly 300 further comprises a bonding layer 350. The bonding layer 350 is positioned between and bonds the electrical component 310 and the first insulating layer 110. Bonding layer 350 may comprise, for example, a pressure-sensitive adhesive, an epoxy, a polyurethane adhesive, or a silicone adhesive. In some other examples, the bonding layer 350 may be aligned with the first-layer opening 112. In these examples, the bonding layer 350 is positioned between and bonds the electrical component 310 with the conductive layer 140. The inclusion of the bonding layer 350 can provide additional mechanical coupling between the electrical component 310 and the flexible circuit 105, which can beneficially reduce strain imparted to the solder joint and/or weld joint during bending, flexing, or thermal cycling of the assembly. Further, such mechanical coupling can increase the overall structural robustness of the flexible circuit assembly by distributing mechanical loads away from the electrical coupling and limiting relative movement between the subassembly 300 and the flexible circuit 105.

Figure 1C:
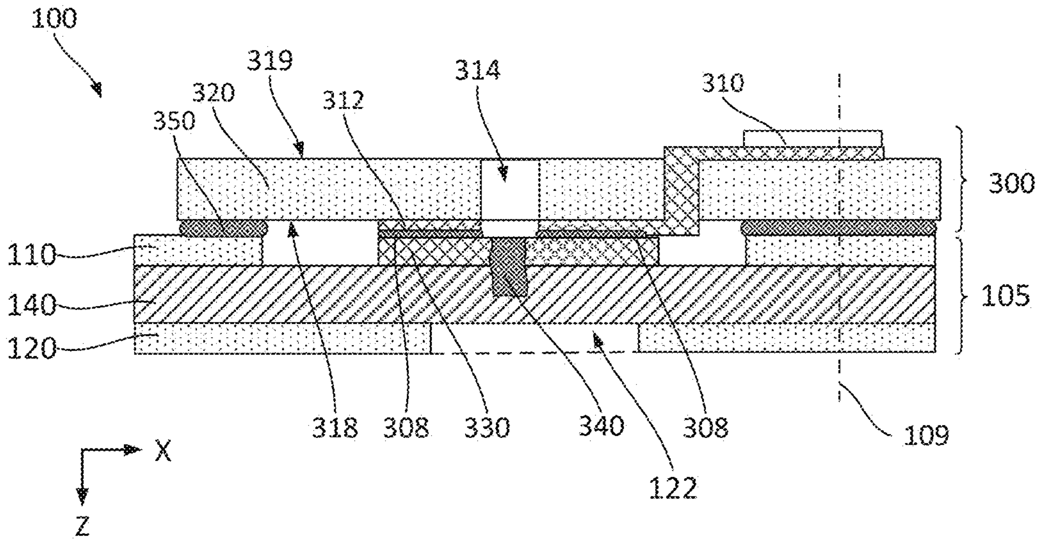
FIG. 1C is a schematic cross-sectional side view of a flexible circuit assembly in which the second insulating layer comprises a second-layer opening, in accordance with some examples.

Turning to FIG. 1C, in some examples, second insulating layer 120 comprises a second-layer opening 122 aligned with the first-layer opening 112 and the weld plug 340 along the stacking axis 109. FIG. 1C is a schematic cross-sectional side view of a flexible circuit assembly 100 in which the second insulating layer 120 comprises a second-layer opening 122, in accordance with some examples. In these examples, the second-layer opening 122 is unfilled, thereby exposing a portion of the conductive layer 140. In some further examples, a portion of the second-layer opening 122 may be aligned with the first-layer opening 112 and the weld plug 340. In other words, either one or both of the first-layer opening 112 and the weld plug 340 project a shape in a plane perpendicular to the stacking axis 109 that at least partially overlaps with a shape projected by the second-layer opening 122 in a plane parallel with the plane of the shape projected by the first-layer opening 112 and the weld plug 340. In some other further examples, the shape projected by the weld plug 340 completely overlaps with the shape projected by the second-layer opening 122. The second-layer opening 122 may be desirable to prevent melting, burning, or other heat-caused damage to the second insulating layer 120 in the vicinity of the weld plug 340.

Figure 1D:
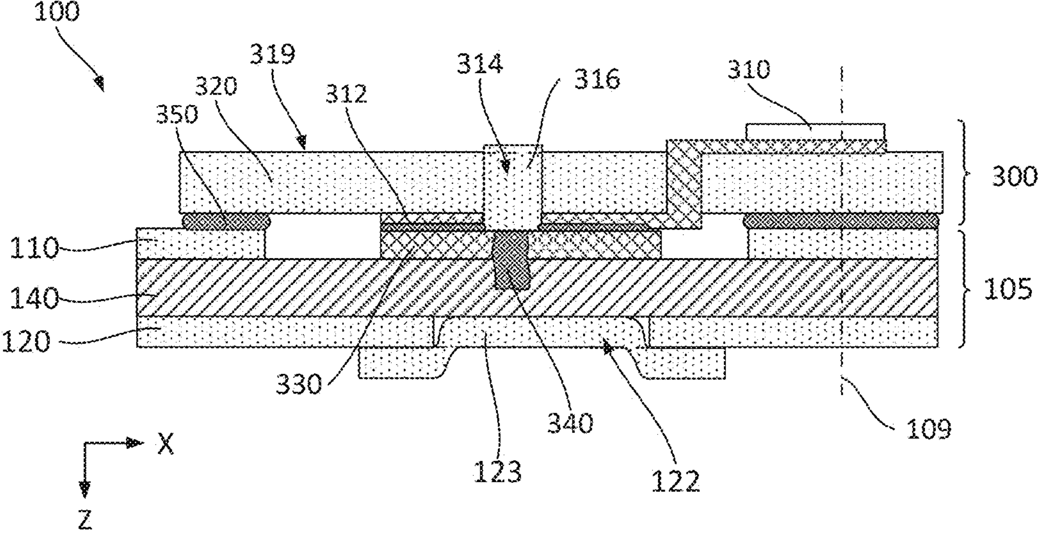
FIG. 1D is a schematic cross-sectional side view of a flexible circuit assembly comprising a second-layer opening and a second-layer opening cover, in accordance with some examples.

In some yet further examples, the flexible circuit 105 may further comprise a second-layer opening cover 123. FIG. 1D is a schematic cross-sectional side view of a flexible circuit assembly 100 comprising a second-layer opening 122 and a second-layer opening cover 123, in accordance with some examples. In these examples, the second-layer opening cover 123 may comprise any of the materials that the second insulating layer 120 may comprise. The second-layer opening cover 123 at least partially or, in some examples, completely covers the second-layer opening 122. In some examples, the second-layer opening cover 123 at least partially overlaps a portion of the second insulating layer 120 such that portions of the second-layer opening cover 123 overlap both the second-layer opening 122 and at least a portion of the second insulating layer 120 and no portion of the conductive layer 140 is exposed in the direction of the second insulating layer 120 from the conductive layer 140. In these examples, a second-layer opening cover 123 may be installed on the flexible circuit 105 following welding of the interconnecting structure 330 to the conductive layer 140. In this way, the second-layer opening cover 123 will not be damaged by heat from welding, and the side of the conductive layer 140 is not exposed.

In some examples, the component opening 314 is unfilled, thereby exposing the weld plug 340 and a portion of the interconnecting structure 330 surrounding the weld plug. In other examples, the electrical component subassembly 300 may comprise a subassembly opening cover 316. In some of these examples, the subassembly opening cover 316 is positioned within the component opening 314, as illustrated in the example of FIG. 1D. In some of these examples, the subassembly opening cover 316 has a length in the direction of the stacking axis 109 that is less than the thickness of the electrical component 310 in the direction of the stacking axis 109. In other of these examples, the length of the subassembly opening cover 316 is greater than the thickness of the electrical component 310 such that a portion of the subassembly opening cover 316 protrudes beyond the electrical component 310 in the direction along the stacking axis 109 away from the interconnecting structure 330. In some of these examples, the subassembly opening cover 316 may be formed from any of the materials that the electrical component 310 may be formed from. In other of these examples, the subassembly opening cover 316 may be formed from any of the materials that the first insulating layer 110 may be formed from. In some examples, the subassembly opening cover 316 is affixed to the first insulating layer 110 by an adhesive, for example, a pressure-sensitive adhesive. In some examples, the subassembly opening cover 316 occludes or covers the component opening 314, thereby preventing portions of the weld plug 340 or the interconnecting structure 330, or both, from being exposed via the component opening 314.

Returning to FIG. 1A, in some examples, the weld plug 340 may extend through the interconnecting structure 330 along the stacking axis 109 and protrude into the conductive layer 140. In other words, in these examples, the weld plug 340 terminates in the conductive layer 140 and does not protrude through a surface of the conductive layer 140 facing the second insulating layer 120. In some other of these examples, the interconnecting structure 330 may be thinner than the conductive layer 140 along the stacking axis 109. Specifically, the interconnecting structure 330 may have a thickness of greater than 20 micrometers, greater than 40 micrometers, greater than 75 micrometers, greater than 100 micrometers, greater than 150 micrometers, or even greater than 180 micrometers. The interconnecting structure 330 may have a thickness less than 250 micrometers, less than 200 micrometers, less than 125 micrometers, less than 80 micrometers, less than 60 micrometers, or even less than 30 micrometers. In some examples, the interconnecting structure 330 has a thickness of 50-200 micrometers. In some examples, the conductive layer 140 has a thickness of at least 300 micrometers, at least 400 micrometers, at least 500 micrometers, or even at least 600 micrometers. In some examples, the conductive layer 140 has a thickness less than 700 micrometers, less than 550 micrometers, less than 450 micrometers, or even less than 350 micrometers. In some other examples, the interconnecting structure 330 and the conductive layer 140 have the same thickness along the stacking axis 109. For example, the conductive layer 140 and the interconnecting structure 330 may each have a thickness of at least 300 micrometers, at least 400 micrometers, at least 500 micrometers, or even at least 600 micrometers. The conductive layer 140 and the interconnecting structure 330 may each have a thickness less than 700 micrometers, less than 550 micrometers, less than 450 micrometers, or even less than 350 micrometers.

Figure 1E:
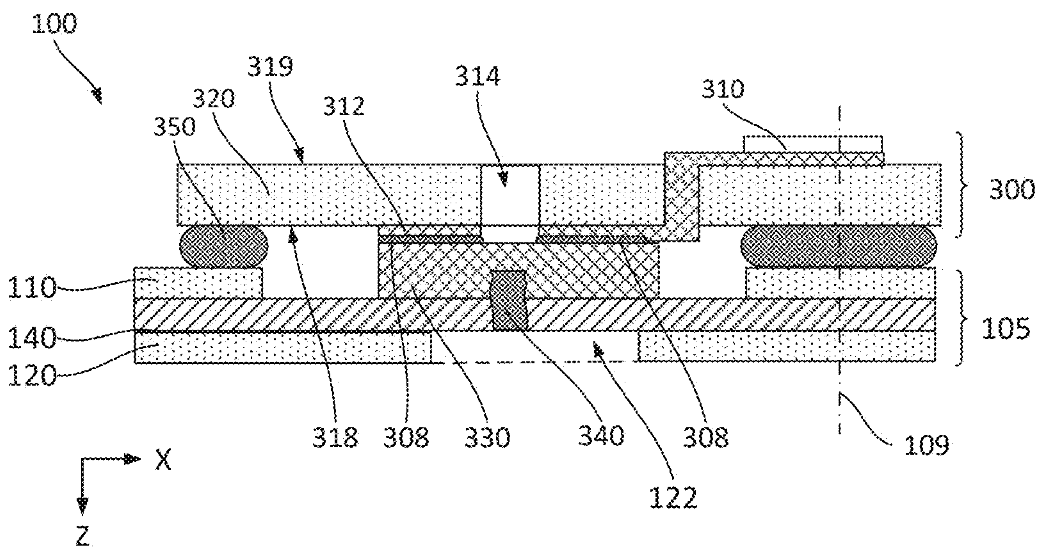
FIG. 1E is a schematic cross-sectional side view of a flexible circuit assembly comprising a second-layer opening and a weld plug extending through the thickness of the conductive layer along the stacking axis and protruding into the interconnecting structure, in accordance with some examples.

In some examples, the weld plug 340 extends through the conductive layer 140 along the stacking axis 109 and protrudes into the interconnecting structure 330. FIG. 1E is a schematic cross-sectional side view of a flexible circuit assembly 100 comprising a second-layer opening 122 and a weld plug 340 extending through the thickness of the conductive layer 140 along the stacking axis 109 and protruding into the interconnecting structure 330, in accordance with some examples. In some of these examples, the thickness of the interconnecting structure 330 is about equal to or greater than the thickness of the conductive layer 140 in the same direction. Without being restricted to any particular theory, it is believed that welding components having the same thickness is easier. However, if the thickness of the interconnecting structure 330 is significantly less than the thickness of the conductive layer 140, and a laser welding beam, for example, is directed at the conductive layer 140 in the direction of the interconnecting structure 330, a welding energy capable of welding the conductive layer 140 may ablate an undesirable hole in the interconnecting structure 330. In some examples, the conductive layer 140 and the interconnecting structure 330 have thicknesses, measured along the stacking axis 109, that differ by less than 50%, less than 30%, or less than 10%.

In some examples, the electrical component 310 is a printed circuit board (PCB) or a printed circuit board assembly (PCBA). In some of these examples, the base 320 comprises a glass-reinforced epoxy laminate material. In the same or other of these examples, the contact pad 312 is a conductive trace formed from, for example, copper or a copper alloy. In some examples, the electrical component 310 is selected from the group consisting of a printed circuit board, a surface mount electronic device, a voltage sensor, a voltage-sense harness, a negative thermal coefficient thermistor, a resistor, a capacitor, a diode, a transistor, an inductor, a transformer, an optoelectronic device, a sensor, a switch, an oscillator, an integrated circuit, another flexible interconnect circuit, and a power supply.

In some examples, the electrical component 310 has more than one electrical contact, the electrical component subassembly 300 comprises more than one contact pad 312 and more than one interconnecting structure 330, and each one of the more than one electrical contacts is electrically coupled with one of the more than one contact pads 312. FIG. 2B is a schematic top view of a flexible circuit assembly 100 in which the flexible circuit 105 comprises two conductive layers 140 and the electrical component 310 has more than one electrical contact, in accordance with some examples. In some of these examples, the flexible circuit assembly 100 comprises more than one conductive layer 140 and each one of the contact pads 312 is mechanically and electrically coupled with one of the conductive layers 140 via one of the more than one interconnecting structures 330. For example, the electrical component 310 may comprise a positive contact pad electrically coupled with a first conductive layer and a negative contact pad electrically coupled with a second conductive layer, and the first conductive layer and the second conductive layer are electrically isolated from one another. In some examples, the subassembly 300 comprises more than one electrical component 310, each electrical component 310 has at least one electrical contact, the subassembly 300 comprises more than one contact pad 312 and more than one interconnecting structure 330, and at least one electrical contact is electrically coupled with one of the more than one contact pads 312.

In some examples wherein the electrical component 310 has more than one electrical contact, each of the more than one interconnecting structure 330 has a width in a plane perpendicular to the stacking axis 109. In some examples, one or more of the more than one interconnecting structures 330 has a different width than others of the more than one interconnecting structures 330. In other examples, each of the one or more interconnecting structures 330 has the same width. For example, in the example of FIG. 2B, one interconnecting structure 330 has a width $W_1$ and another interconnecting structure 330 has a width of $W_2$, and $W_2$ is equal to $W_1$. In some examples, as in the example shown in FIG. 2B, the width may be measured in the direction separating the more than one conductive layer 140 from one another. In some examples, the width is less than 5 millimeters, less than 4 millimeters, less than 2 millimeters, less than 1 millimeter, less than 750 micrometers, less than 500 micrometers, less than 400 micrometers, or even less than 300 micrometers. In these examples, each of the more than one interconnecting structure 330 is separated from each closest other one or two of the more than one interconnecting structure 330 by a pitch. The pitch is the distance between the closest edges of adjacent of the one or more interconnecting structures 330 measured in the same direction as the width. For example, as shown in FIG. 2B, the pitch is shown as the distance P. In some examples, the pitch is less than 5 millimeters, less than 4 millimeters, less than 2 millimeters, less than 1 millimeter, less than 750 micrometers, less than 500 micrometers, less than 400 micrometers, or even less than 300 micrometers. In some examples, the width of each of the more than one interconnecting structure 330 is 300 micrometers, and the pitch is 300 micrometers.

Figure 1F:
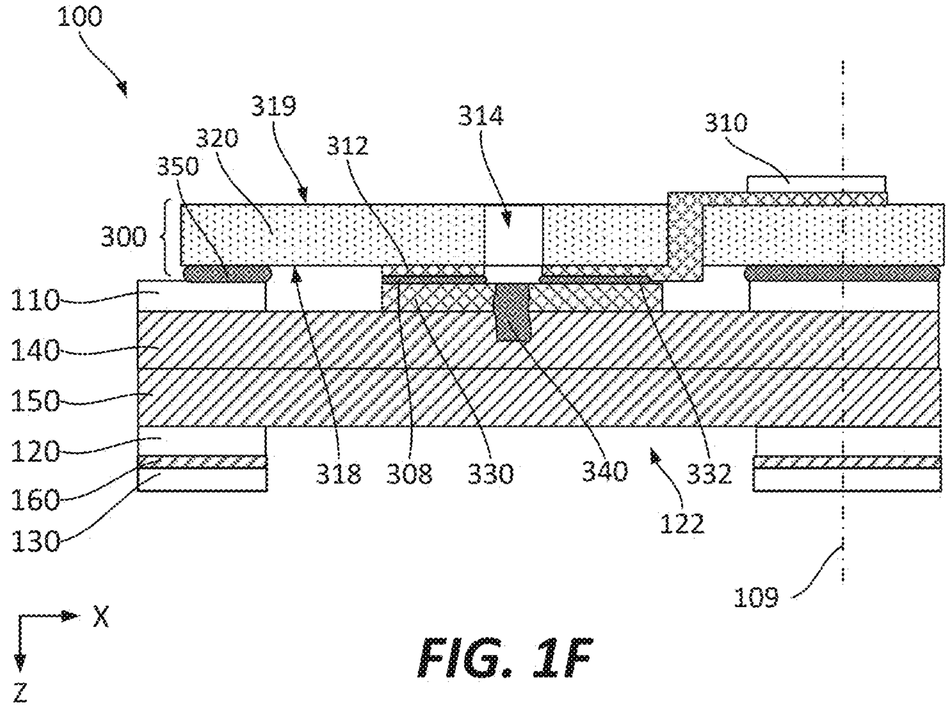
FIG. 1F is a schematic cross-sectional side view of a flexible circuit assembly comprising a conductive layer and an additional conductive layer, in accordance with some examples.

In some examples, the flexible circuit assembly 100 comprises an additional conductive layer 150. FIG. 1F is a schematic cross-sectional side view of a flexible circuit assembly 100 comprising a conductive layer 140 and an additional conductive layer 150, in accordance with some examples. In these examples, the additional conductive layer 150 is stacked between the conductive layer 140 and the second insulating layer 120 along the stacking axis 109. The additional conductive layer 150 comprises aluminum. In some examples, the additional conductive layer 150 has a thickness of at least 100 micrometers, at least 200 micrometers, at least 400 micrometers, or even at least 600 micrometers. In some further examples, the additional conductive layer 150 directly interfaces the conductive layer 140.

In the example shown in FIG. 1F, the weld plug 340 does not extend through the thickness of the conductive layer 140 in the direction of the stacking axis 109. In other examples, the weld plug 340 extends through the thickness of the conductive layer 140 in the direction of the stacking axis 109 and protrudes into the additional conductive layer 150. In these examples, the weld plug 340 mechanically and electrically couples the conductive layer 140 and the additional conductive layer 150.

In some examples, the flexible circuit 105 further comprises a third insulating layer 130 and an electromagnetic shield 160 stacked between the second insulating layer 120 and the third insulating layer 130 along the stacking axis 109. FIG. 1H is a schematic cross-sectional side view of a flexible circuit assembly 100 comprising a third insulating layer 130 and an electromagnetic shield 160 stacked between the second insulating layer 120 and the third insulating layer 130 along the stacking axis 109, in accordance with some examples. In these examples, the second insulating layer 120 is stacked between the conductive layer 140 and the electromagnetic shield 160 along the stacking axis 109. The electromagnetic shield 160 is configured to block electromagnetic emissions produced by the stack while transmitting electric current. In some examples, the electromagnetic shield 160 is a metal sheet having a thickness, measured along the stacking axis 109, of 20-150 micrometers. For example, the thickness may be between 20-100 micrometers, between 30-125 micrometers, or even between 50-150 micrometers. In some examples, the electromagnetic shield 160 extends in a direction along the width of the flexible circuit 105 the same distance as the conductive layer 140. In some of these examples, a projection of the electromagnetic shield 160 in a direction parallel with the stacking axis 109 overlaps with a projection of the conductive layer 140. In some other of these examples, a projection of the electromagnetic shield 160 aligns with a projection of the conductive layer 140. In some other examples, the electromagnetic shield 160 extends in a direction along the width of the flexible circuit 105 a distance greater than the conductive layer 140 extends in the same direction. In these examples, a projection of the electromagnetic shield 160 in a direction parallel with the stacking axis 109 overlaps with a projection of the conductive layer 140. In some examples, the metal sheet of the electromagnetic shield 160 is formed from aluminum.

In some further examples, the third insulating layer 130 comprises polypropylene. As shown in the example of FIG. 1F, in some examples, the second insulating layer 120 comprises a second-layer opening 122 aligned with the weld plug 340 and the interconnecting structure 330, as described above, and further the electromagnetic shield 160 and third insulating layer 130 each also comprise an opening aligned with the weld plug 340 and the interconnecting structure 330.

Figure 1G:
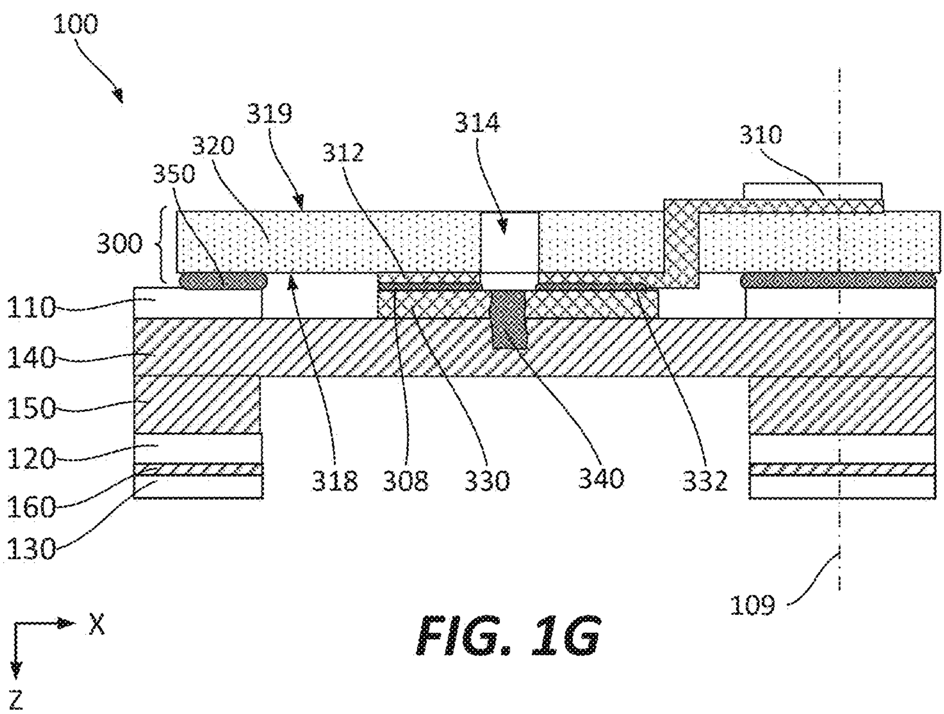
FIG. 1G is a schematic cross-sectional side view of a flexible circuit assembly comprising a conductive layer and an additional conductive layer, wherein the additional conductive layer comprises an opening aligned with the weld plug and the interconnecting structure along the stacking axis, in accordance with some examples.
Figure 1H:
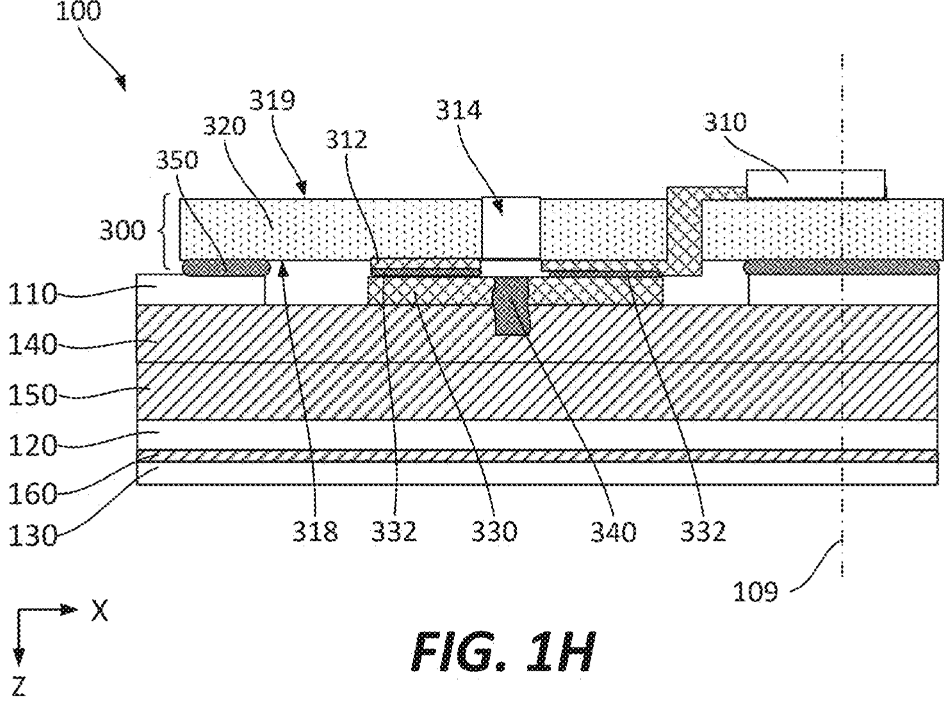
FIG. 1H is a schematic cross-sectional side view of a flexible circuit assembly comprising a conductive layer and an additional conductive layer, in accordance with some examples.

FIG. 1G is a schematic cross-sectional side view of a flexible circuit assembly 100 comprising a conductive layer 140 and an additional conductive layer 150, wherein the additional conductive layer 150 comprises an opening aligned with the weld plug 340 and the interconnecting structure 330 along the stacking axis 109, in accordance with some examples. In these examples, conductive layer 140 is exposed through the opening in the additional conductive layer 150. In some further examples, as in the example shown in FIG. 1G, the second insulating layer 120, the electromagnetic shield 160, and the third insulating layer 130 also each comprise an opening aligned with the weld plug 340 and the interconnecting structure 330 along the stacking axis 109. In other examples, none of the additional conductive layer 150, the second insulating layer 120, the electromagnetic shield 160, and the third insulating layer 130 comprise an opening aligned with the weld plug 340 and the interconnecting structure 330 along the stacking axis 109. For example, in the example of FIG. 1H, the additional conductive layer 150, the second insulating layer 120, the electromagnetic shield 160, and the third insulating layer 130 do not have openings that align with the weld plug 340.

Figure 2A:
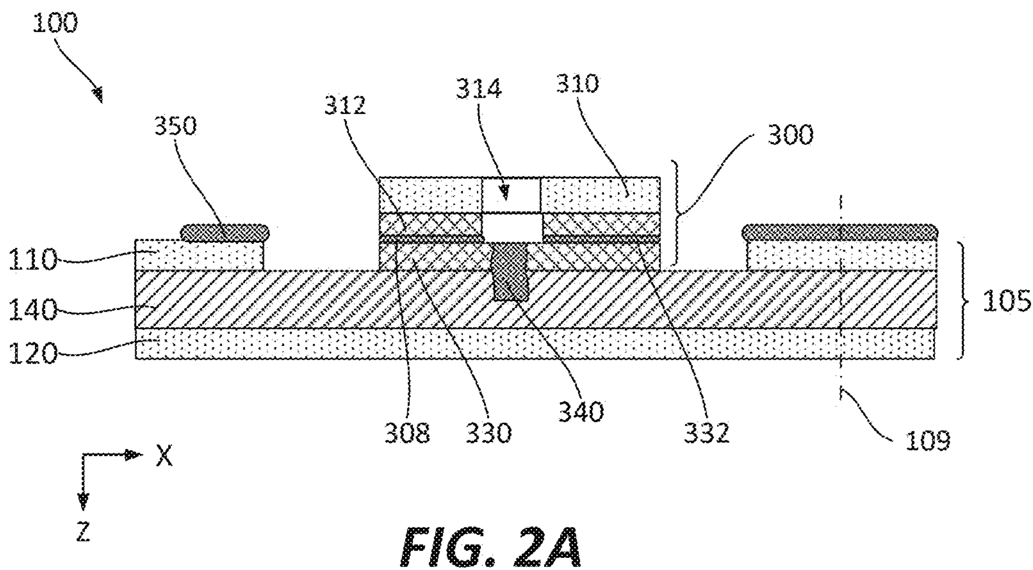
FIG. 2A is a schematic cross-sectional side view of a flexible circuit assembly wherein the subassembly comprises an electrical component comprising a contact pad soldered to an interconnecting structure, in accordance with some examples.
Figure 2B:
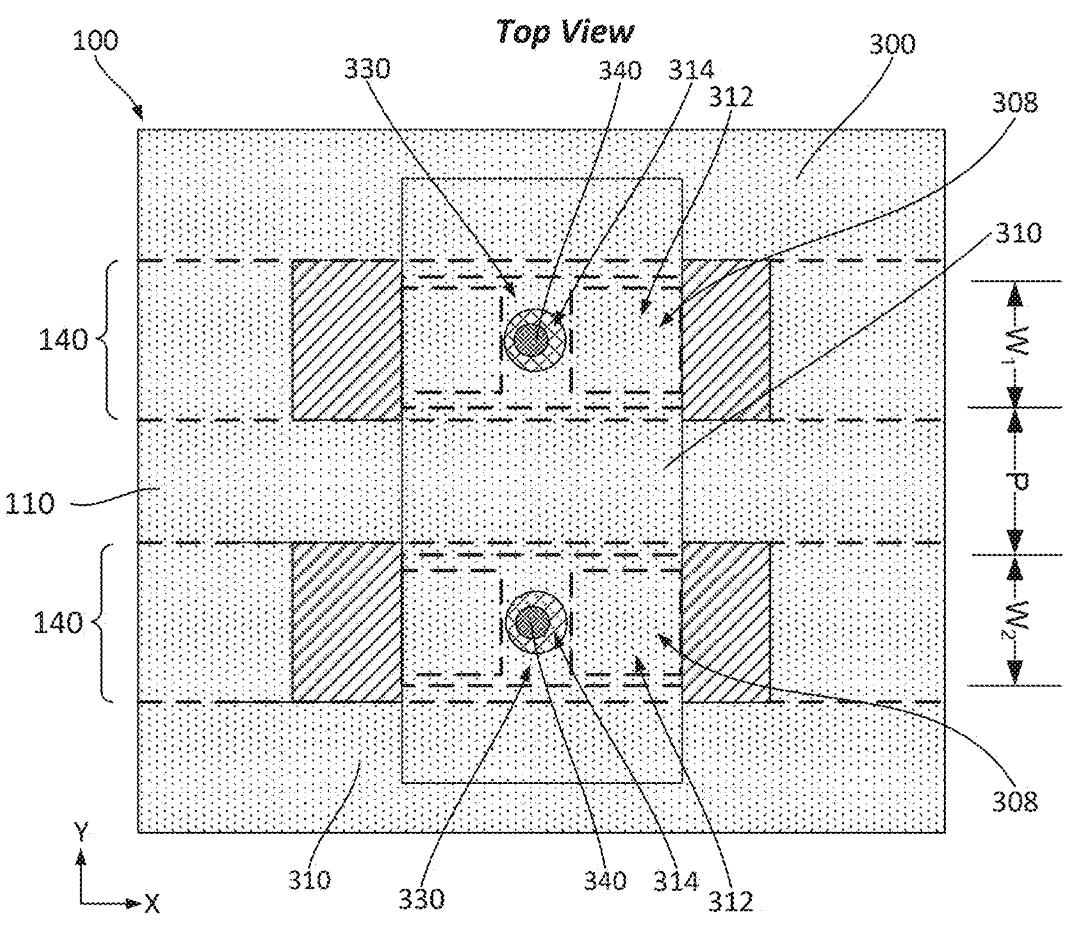
FIG. 2B is a schematic top view of a flexible circuit assembly in which the flexible circuit comprises two conductive layers and the electrical component has more than one electrical contact, in accordance with some examples.

FIG. 2A is a schematic cross-sectional side view of a flexible circuit assembly 100 wherein the subassembly 300 comprises an electrical component 310 comprising a contact pad 312 soldered to an interconnecting structure 330, in accordance with some examples. In the example of FIG. 2A, the interconnecting structure 330 is mechanically and electrically coupled with the flexible circuit 105 via the weld plug 340, and the electrical component 310 is mechanically and electrically coupled with the flexible circuit 105 via the solder patch 308, which, in turn, couples the contact pad 312 with the interconnecting structure 330. In some examples, the electrical component 310 is not mechanically coupled with the flexible circuit 105 via one or more bonding layers 350. In such implementations, the mechanical coupling provided solely through the solder patch 308 and the welded interconnecting structure 330 can offer several benefits. For instance, omission of a bonding layer 350 can reduce the overall mass of the flexible circuit assembly 100 by eliminating adhesive material associated with such layers. Additionally, omitting the bonding layer can lower material and processing costs and simplify the manufacturing flow by reducing the number of assembly steps, thereby improving production efficiency while still maintaining adequate mechanical and electrical coupling between the electrical component 310 and the flexible circuit 105.

FIG. 2B is a schematic top view of a flexible circuit assembly 100 comprising a flexible circuit 105 with two conductive layers 140, two interconnecting structures 330, and an electrical component 310 with two contacts, wherein each one of the two contacts is electrically coupled with one of the two conductive layers 140 via one of the two interconnecting structures 330, in accordance with some examples. For example, the electrical component 310 in this example may be a voltage sense harness, and one of the contacts is a positive contact and one of the contacts is a negative contact. Both conductive layers 140 can be positioned on the same circuit level (e.g., in the same plane and formed from the same metal foil) or different circuit levels (e.g., when different conductive traces form a stack along the thickness along the stacking axis 109).

Figure 2C:
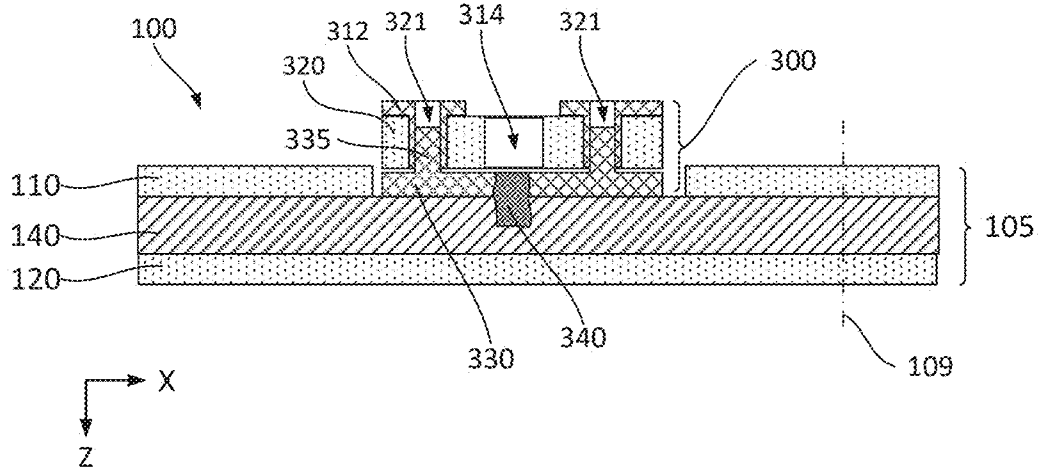
FIG. 2C is a schematic cross-sectional side view of a flexible circuit assembly comprising an interconnecting structure comprising an interconnecting protrusion, in accordance with some examples.
Figure 2D:
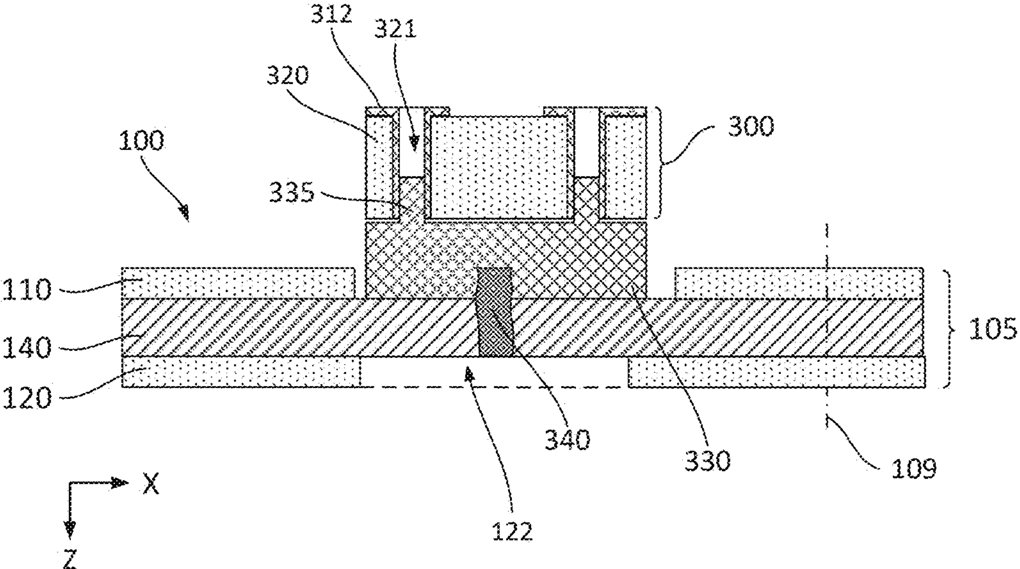
FIG. 2D is a schematic cross-sectional side view of a flexible circuit assembly comprising an interconnecting structure comprising an interconnecting protrusion, wherein the second insulating layer comprises a second-layer opening and the weld plug extends through the conductive layer and protrudes into the interconnecting structure, in accordance with some examples.

FIGS. 2C-D: Examples of Flexible Circuit Assemblies Comprising Press-Fit Interconnecting Protrusions In some examples, the interconnecting structure 330 comprises an interconnecting protrusion 335. In these examples, the base 320 comprises a connecting opening 321 and the interconnecting protrusion 335 is press-fit into the connecting opening 321. FIG. 2C is a schematic cross-sectional side view of a flexible circuit assembly 100 comprising an interconnecting structure 330 comprising an interconnecting protrusion 335, in accordance with some examples. In some of these examples, as shown in FIG. 2C, the contact pad 312 extends into the connecting opening 321 and the interconnecting protrusion 335 thereby directly interfaces and is pressed against the contact pad 312 within the connecting opening 321. In other examples, a portion of the contact pad 312 is positioned on the same side of the base 320 as the interconnecting structure 330, and positioned between the base 320 and the interconnecting structure 330. In these examples, the interconnecting structure 330 directly interfaces and is pressed against the contact pad 312 when the interconnecting protrusion 335 is press-fit into the connecting opening 321. In the example shown in FIG. 2C, the interconnecting structure 330 comprises two interconnecting protrusions 335. In other examples, the interconnecting structure 330 comprises one, more than two, more than four, more than seven, more than 11, or even more than 15 interconnecting protrusions 335. The base 320 may have at least as many connecting openings 321 as the interconnecting structure 330 has interconnecting protrusions 335. An interconnecting structure 330, as in the example shown in FIG. 2C, may provide benefits over other examples of interconnecting structure 330, especially for applications involving large electrical currents. The interconnecting structure 330 of the example of FIG. 2C may have a larger cross-section both in portions interfacing the conductive layer 140 and in portions interfacing the contact pad 312, allowing for conduction of large electrical currents with less resistance. In addition, the surface area of the interface between an interconnecting protrusion 335 and the contact pad 312 may be larger, also allowing for conduction of large electrical currents with less resistance. The interconnecting structure 330 of the example of FIG. 2C may also provide benefits of positive alignment enforcement and reversible coupling between the base 320 and the flexible circuit 105.

FIG. 2D is a schematic cross-sectional side view of a flexible circuit assembly 100 comprising an interconnecting structure 330 comprising an interconnecting protrusion 335, wherein the second insulating layer 120 comprises a second-layer opening 122, in accordance with some examples. In the example of FIG. 2D, the second-layer opening 122 is aligned with the weld plug 340 and the interconnecting structure 330. The interconnecting structure 330 is thicker than the conductive layer 140 in the direction of the stacking axis 109. The weld plug 340 extends through the conductive layer 140 and protrudes into the interconnecting structure 330.

Figure 2E:
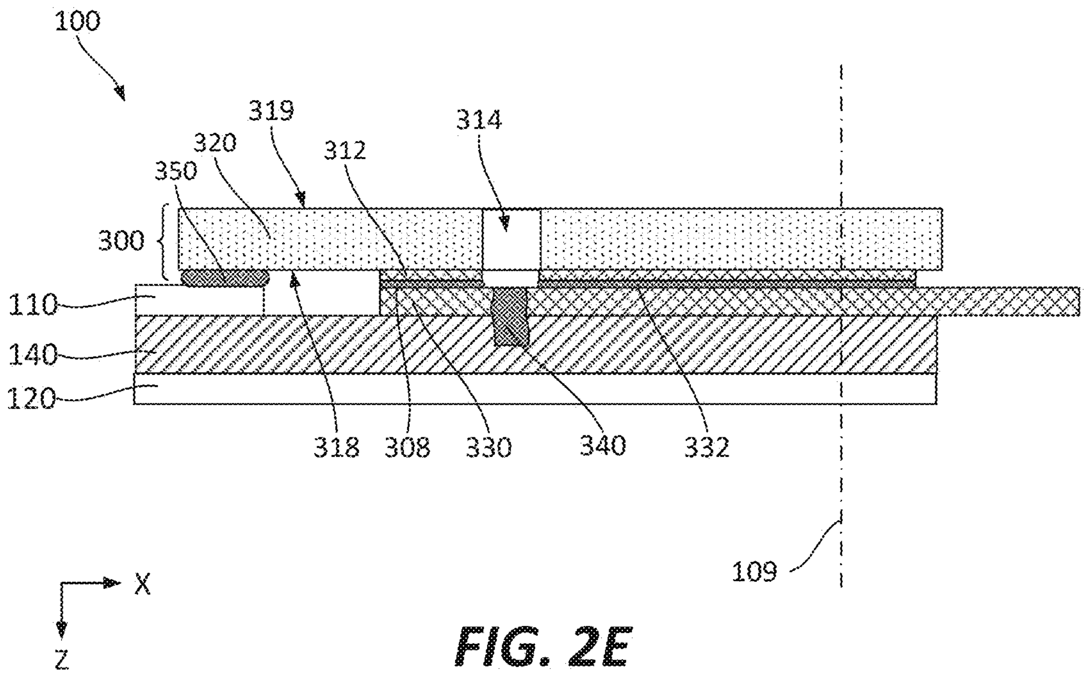
FIG. 2E is a schematic cross-sectional side view of a flexible circuit assembly wherein a portion of interconnecting structure protrudes from between the electrical component and the flexible circuit, in accordance with some examples.
Figure 2F:
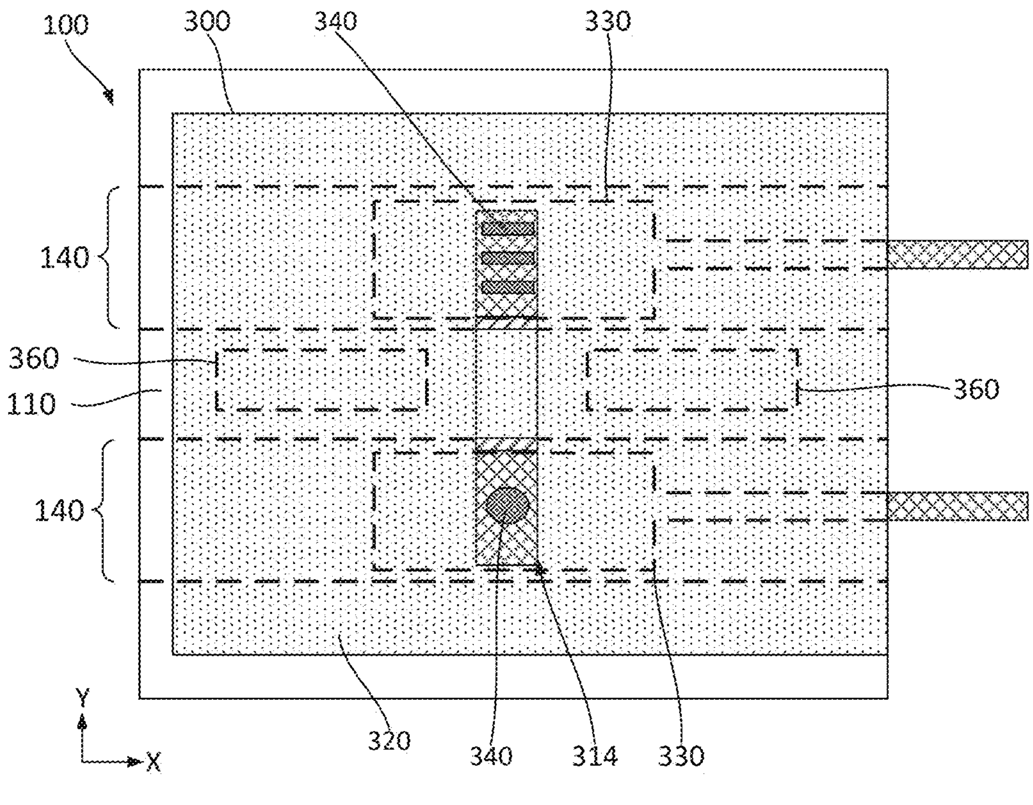
FIG. 2F is a schematic top view of the flexible circuit assembly of FIG. 2E, in accordance with some examples.

FIGS. 2E-F: Examples of Flexible Circuit Assemblies Comprising Protruding Interconnecting Structures FIG. 2E is a schematic cross-sectional side view of a flexible circuit assembly 100 wherein a portion of interconnecting structure 330 protrudes from between the electrical component 310 and the flexible circuit 105, in accordance with some examples. FIG. 2F is a schematic top view of the flexible circuit assembly 100 of FIG. 2E, in accordance with some examples. In some examples, a portion of the interconnecting structure 330 protrudes from between the electrical component 310 and the flexible circuit 105. In these examples, the interconnecting structure 330 may extend a distance from the electrical component 310 to allow physical and electrical coupling of the protruding portion of the interconnecting structure 330 with other electrical components. In some further examples, the dimensions of the protruding portion of the interconnecting structure 330 in the direction of the stacking axis 109 and orthogonal to the stacking axis 109 may be such that an electrical connector can be mechanically and electrically coupled with the interconnecting structure 330. In some further examples, wherein the flexible circuit assembly 100 comprises more than one interconnecting structure 330 with portions that protrude from between the electrical component 310 and the flexible circuit 105, the more than one interconnecting structure 330 may be spaced in a direction along which the individual interconnecting structures 330 are separated such that each interconnecting structure 330 may be mechanically and physically coupled with the same electrical connector.

In some examples, more than one weld plug 340 may weld the interconnecting structure 330 to the conductive layer 140, as shown in FIG. 2F. In these examples, the more than one weld plug 340 welding the interconnecting structure 330 to the conductive layer 140 provides redundancy. In other words, if one weld plug 340 welding an interconnecting structure 330 to a conductive layer 140 fails, there is another weld plug 340 in these examples to maintain the connection.

In some examples, the flexible circuit 105 comprises stability islands 360 that are metal islands patterned from the same metal foil as the conductive layer 140 but electrically disconnected from the conductive layer 140. In these examples, stability islands 360 are positioned between the first insulating layer 110 and the second insulating layer 120. Such islands are shown, for example, in FIG. 2F. Such islands may increase stability of the conductive layer 140 during manufacturing of the flexible circuit assembly 100. For example, the stability islands 360 may have a greater surface area locally than the conductive layer 140, providing stability to nearby conductive layer 140 during curing of adhesives that adhere the first insulating layer 110 and the second insulating layer 120 to the conductive layer 140.

Figure 2G:
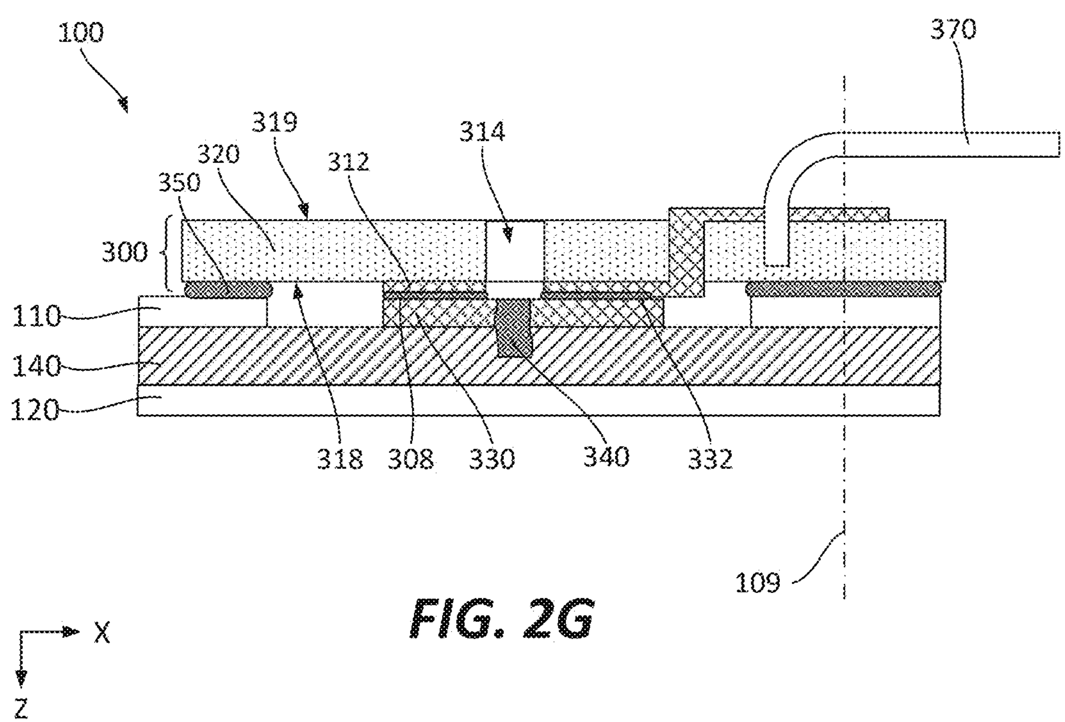
FIG. 2G is a schematic cross-sectional side view of a flexible circuit assembly wherein the electrical component comprises a connecting pin, in accordance with some examples.
Figure 2H:
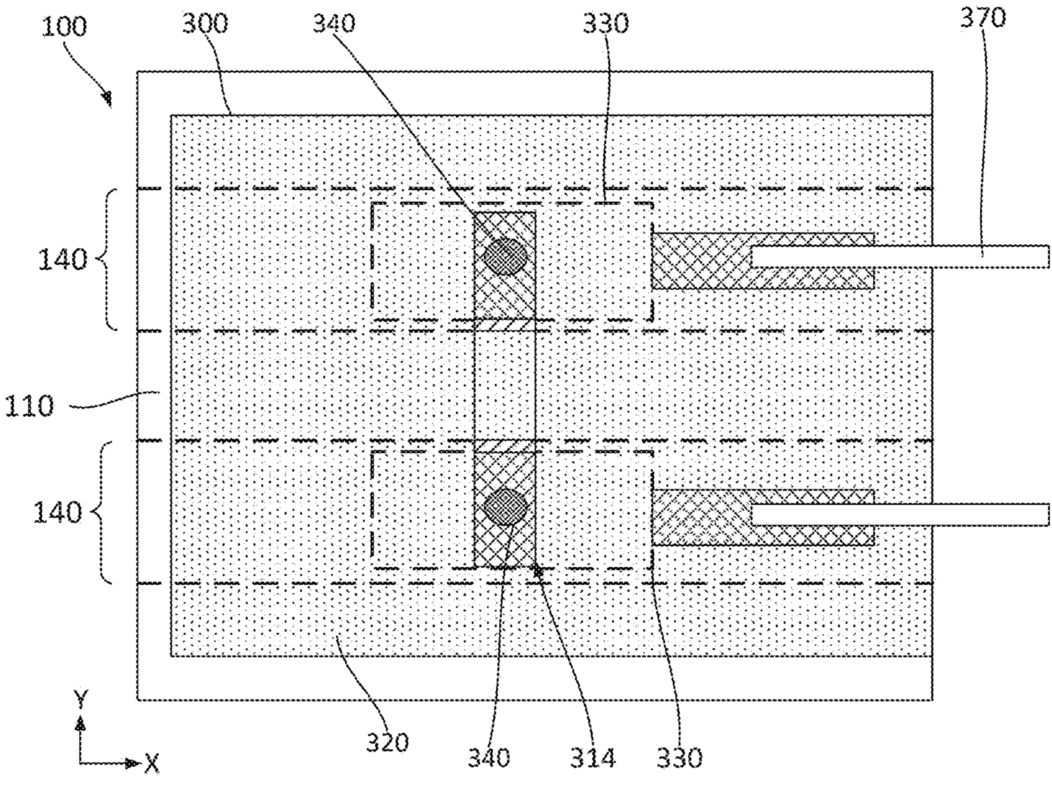
FIG. 2H is a schematic top view of the flexible circuit assembly of FIG. 2G, in accordance with some examples.

FIGS. 2G-H: Examples of Flexible Circuit Assemblies Comprising Connecting Pins FIG. 2G is a schematic cross-sectional side view of a flexible circuit assembly 100 wherein the electrical component 310 comprises a connecting pin 370, in accordance with some examples. FIG. 2H is a schematic top view of the flexible circuit assembly 100 of FIG. 2G, in accordance with some examples. In some examples, the electrical component 310 comprises a connecting pin 370. The connecting pin 370 is electrically coupled with the contact pad 312, thereby electrically coupling the connecting pin 370 with the interconnecting structure 330. In some further examples, the connecting pin 370 may be press-fit into a hole or recess in the base 320, thereby physically and electrically coupling the connecting pin 370 with the contact pad 312, as shown in the Example of FIG. 2G. In some examples, the connecting pin 370 may extend substantially normal to a surface of the base 320, in other words, parallel with the stacking axis 109. In some other examples, the connecting pin 370 may bend and a portion of the connecting pin 370 may extend orthogonal to the stacking axis 109, as shown in the example of FIG. 2G, or in another direction not parallel with the stacking axis 109. The dimensions of the connecting pin 370 may be such that physical and electrical connection can be readily made to the connecting pin 370 by an external connector or other external electrical component. The connecting pin 370 may have a cross-sectional shape that is, for example, round, ovoid, square, rectangular, or hexagonal. When more than one connecting pin 370 is present, each connecting pin 370 may have the same or different cross-sectional shape than another connecting pin 370. Use of the connecting pin 370 can provide the benefit of enabling a robust, low-resistance, and easily accessible external interface point that facilitates reliable engagement with connectors.

Figure 3A:
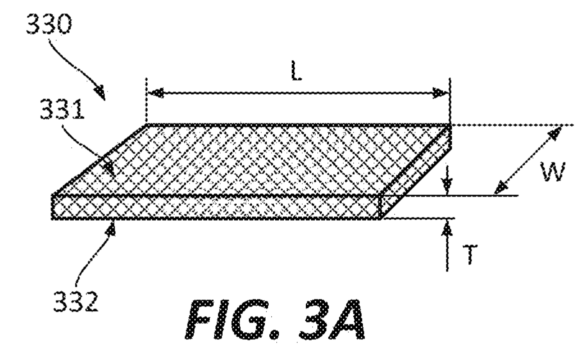
FIG. 3A is a schematic isometric view of an interconnecting structure, in accordance with some examples.
Figure 3B:
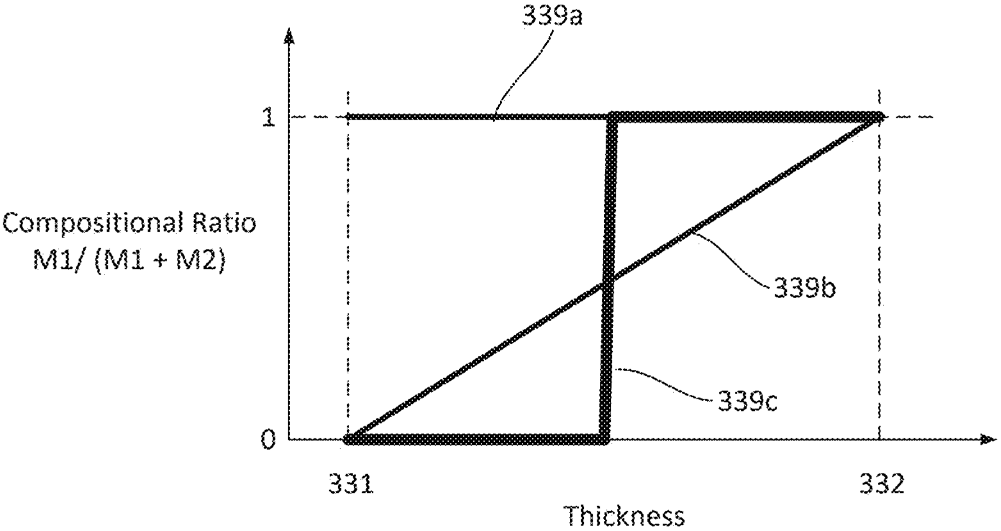
FIGS. 3B and 3C are plots of compositional ratios of interconnecting structure along the thickness, in accordance with some examples.
Figure 3C:
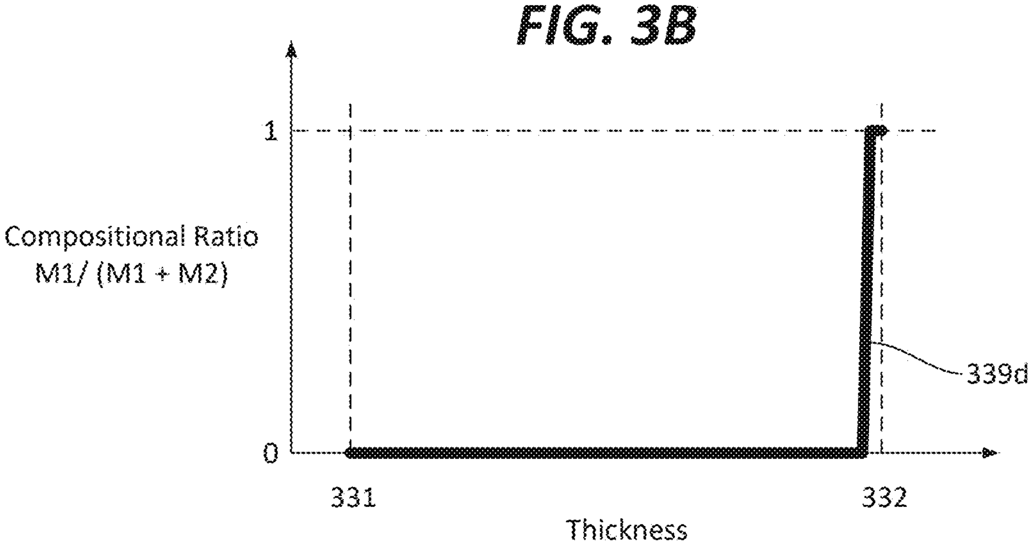

FIGS. 3A-C: Examples of Flexible Circuit Assemblies Comprising Multilayered Interconnecting Structures FIG. 3A is a schematic isometric view of an interconnecting structure 330, in accordance with some examples. The example interconnecting structure 330 shown in FIG. 3A comprises a first surface 331, and a second surface 332 opposite the first surface 331. The interconnecting structure 330 comprises a thickness T, which is the distance separating the first surface 331 and the second surface 332. The interconnecting structure 330 also comprises a length L, and a width W, each extending orthogonal to the thickness and orthogonal to one another. FIG. 3B is a plot of a compositional ratio of the interconnecting structure 330 along the thickness. The compositional ratio is calculated as M1/(M1+M2), where M1 represents an amount of a first material and M2 is an amount of a second material. M1 and M2 may both represent amounts by weight or relative amounts by volume or mole fraction.

In some examples, the interconnecting structure 330 has a uniform composition through an entire volume of the interconnecting structure 330. Trace 339*a* in FIG. 3B represents the composition of an interconnecting structure 330 having a uniform composition through the entire volume of the interconnecting structure 330. In other words, in the composition of the interconnecting structure 330 represented by trace 339*a*, M1 is a first composition and M2 is not present and therefore equal to zero across the thickness, and the compositional ratio is 1/(1+0), or 1, across the thickness.

In some other examples, the interconnecting structure 330 comprises a first surface 331 and a second surface 332 having a different composition than the first surface 331. In some of these other examples, the composition varies continuously over the thickness, as represented by trace 339*b* of FIG. 3B. The composition represented by trace 339*b* varies linearly in composition across the thickness, but other relationships between the compositional ratio and the thickness that vary continuously are within the scope. In some other of these other examples, the composition transitions sharply at one point along the thickness, as represented by trace 339*c* of FIG. 3B. The transition in composition in trace 339*c* is shown halfway across the thickness, representing an interconnecting structure 330 comprising equal thicknesses of the two materials. Other transition points along the thickness are within the scope. For example, as shown in trace 339*d* of FIG. 3C, the thickness may comprise mostly a second material with a thin layer of a first material. In still further examples, the interconnecting structure 330 comprises more than two materials. In some examples, the interconnecting structure 330 comprises a clad, where two materials are mechanically coupled. In some examples, the interconnecting structure 330 is formed by coating a layer of a first material onto a second material by methods including tinning, evaporating, soldering, welding, cladding, sputtering, plating, and cold-welding.

Figure 4:
FIG. 4 is a process flowchart corresponding to a method for fabricating a flexible circuit assembly comprising a stacking axis, in accordance with some examples.
Figure 4:
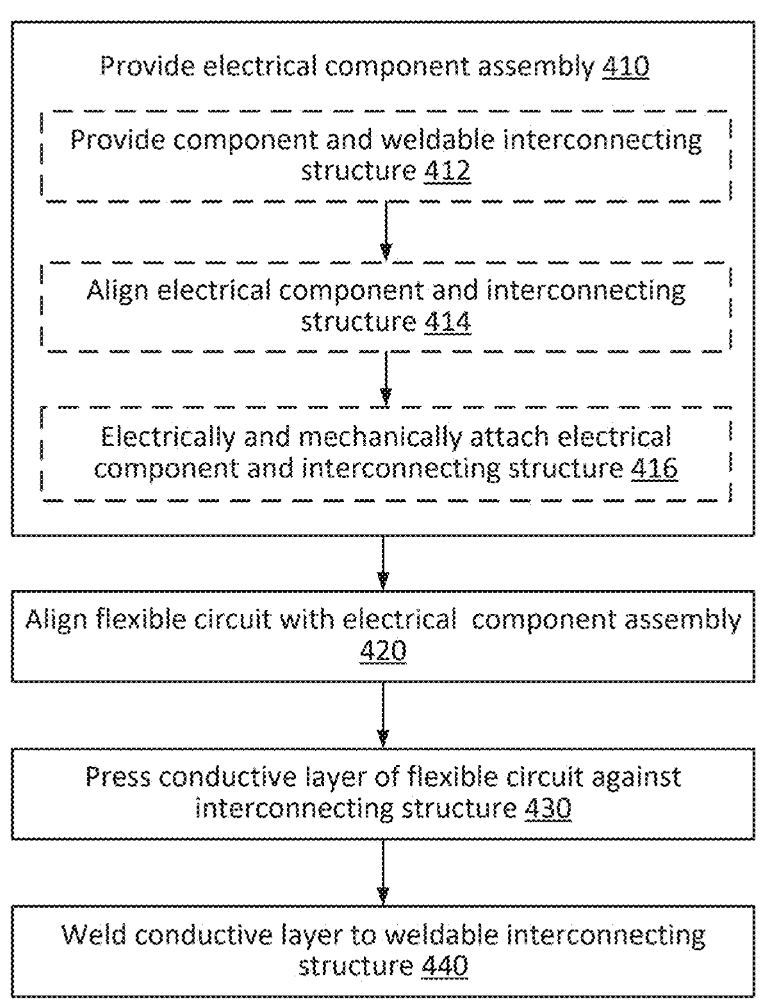
Figure 5A:
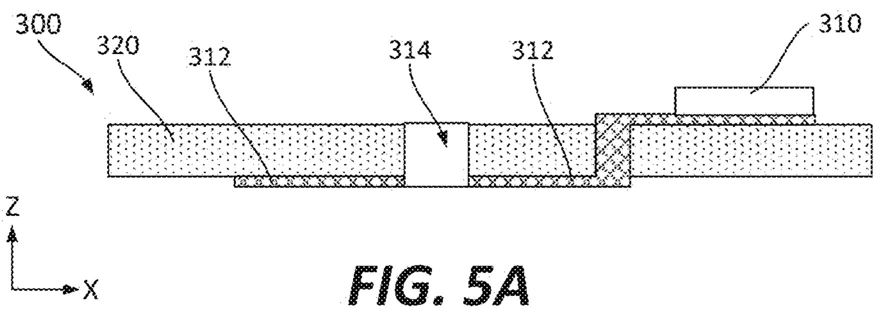
FIG. 5A is a schematic cross-sectional side view of a subassembly comprising an electrical component and a contact pad, in accordance with some examples.
Figure 5B:
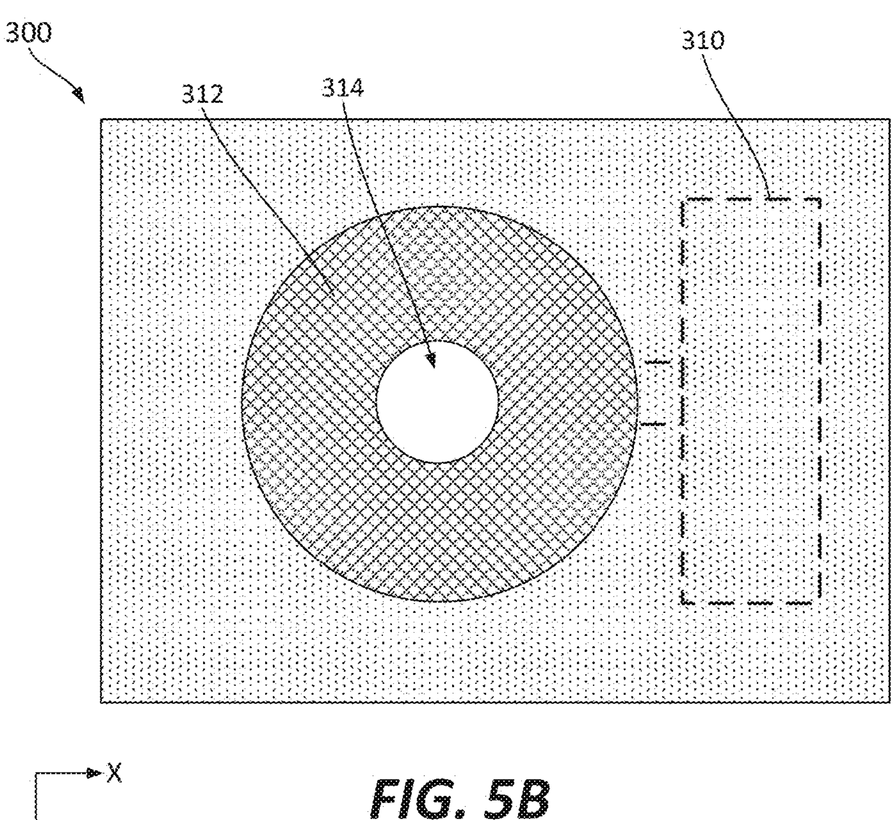
FIG. 5B is a bottom view of the subassembly of FIG. 5A, in accordance with some examples.

FIGS. 4, 5A-B, 6A-C, and 7A-C: Examples of Methods of Fabricating Flexible Circuit Assemblies FIG. 4 is a process flowchart corresponding to method 400 for fabricating a flexible circuit assembly 100 comprising a stacking axis 109, in accordance with some examples. Various examples and features of flexible circuit assembly 100 have been described above. Method 400 comprises (block 410) providing an electrical component subassembly 300 comprising an electrical component 310 and an interconnecting structure 330. FIG. 5A is a schematic cross-sectional side view of a subassembly 300 comprising an electrical component 310 and a contact pad 312, in accordance with some examples. FIG. 5B is a bottom view of the subassembly 300 of FIG. 5A, in accordance with some examples. The electrical component 310 comprises a base 320, a contact pad 312 comprising copper and stacked with the base 320, and a component opening 314. The component opening 314 extends through each of the base 320 and the contact pad 312. The component opening 314 comprises a largest cross-sectional dimension 315, perpendicular to the stacking axis 109, fully overlapping with the interconnecting structure 330. The interconnecting structure 330 is soldered to the contact pad 312 by a solder patch 308 and comprises one or more materials selected from the group consisting of nickel, brass, and copper.

In some examples, providing an electrical component subassembly 300 comprises (block 412) providing an electrical component 310 and an interconnecting structure 330, (block 414) aligning the electrical component 310 and the interconnecting structure 330, and (block 416) electrically and mechanically attaching the electrical component 310 and the interconnecting structure 330. FIG. 6A is a schematic cross-sectional side view of a subassembly 300 comprising an electrical component 310 and a contact pad 312, as well as an interconnecting structure 330, after alignment of the electrical component 310 with the interconnecting structure 330 but before soldering, in accordance with some examples. FIG. 6B is a schematic cross-sectional side view of the subassembly 300 of FIG. 6A after soldering the interconnecting structure 330 to the contact pad 312, in accordance with some examples.

Various examples of subassemblies 300 are provided above. For example, in some examples, the subassembly 300 may comprise a base 320 comprising a glass-reinforced epoxy laminate material. In some examples, the subassembly 300 may comprise an electrical component 310 selected from the group consisting of a printed circuit board, a surface mount electronic device, a voltage sensor, a voltage-sense harness, a negative thermal coefficient thermistor, a resistor, a capacitor, a diode, a transistor, an inductor, a transformer, an optoelectronic device, a sensor, a switch, an oscillator, an integrated circuit, another flexible interconnect circuit, and a power supply.

In some examples, a subassembly 300 is provided as an assembly with an interconnecting structure 330 attached to the electrical component 310. For example, the subassembly 300 may comprise a printed circuit board assembly comprising copper traces and an interconnecting structure 330 soldered to the traces.

Method 400 further comprises (block 420) aligning a flexible circuit 105 with the electrical component subassembly 300. The flexible circuit 105 comprises a first insulating layer 110, a conductive layer 140, and a second insulating layer 120. The conductive layer 140 comprises aluminum and is stacked between the first insulating layer 110 and the second insulating layer 120 along a stacking axis 109. The first insulating layer 110 comprises a first-layer opening 112.

Method 400 further comprises (block 430) pressing the conductive layer 140 against the interconnecting structure 330. The interconnecting structure 330 is stacked between the contact pad 312 and the conductive layer 140 along the stacking axis 109. At least a portion of the interconnecting structure 330, which is aligned with the electrical component 310, directly interfaces the conductive layer 140.

In some examples, pressing the conductive layer 140 against the interconnecting structure 330 comprises contacting the base 320 with a first set of clamps 610, contacting the flexible circuit 105 with a second set of clamps 620, and advancing the first set of clamps 610 and the second set of clamps 620 toward one another. In some other examples, during pressing the conductive layer 140 against the interconnecting structure 330, the second set of clamps 620 directly interfaces the conductive layer 140.

Figure 7A:
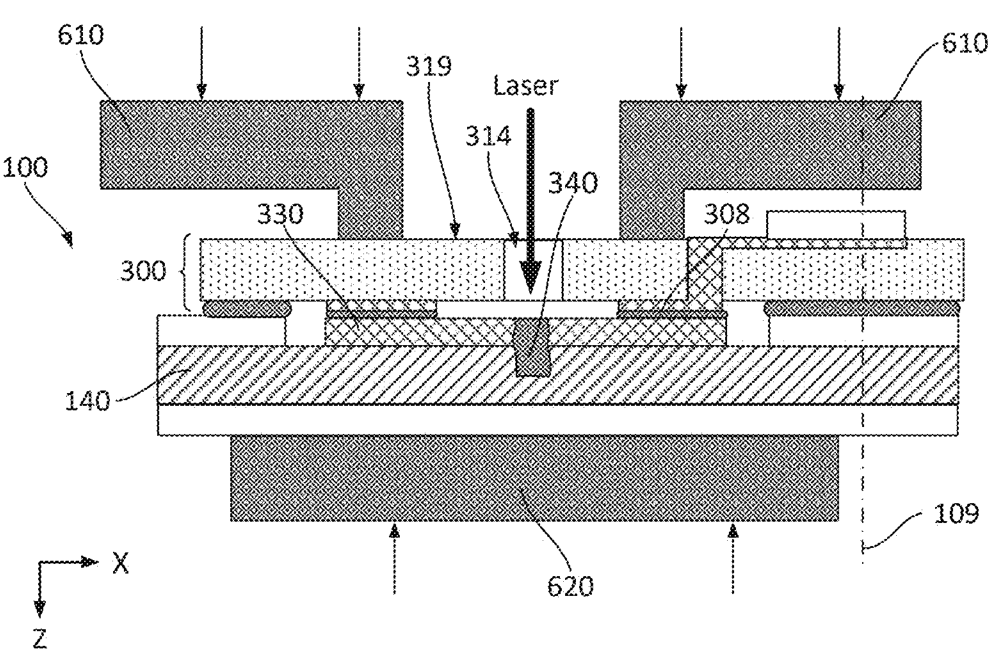
FIG. 7A is a schematic cross-sectional side view of a flexible circuit assembly, during welding, in which the conductive layer is pressed against the interconnecting structure by contact of the base with a first set of clamps, contact of the flexible circuit with a second set of clamps, and advancing of the first set of clamps and the second set of clamps toward one another, in accordance with some examples.
Figure 7B:
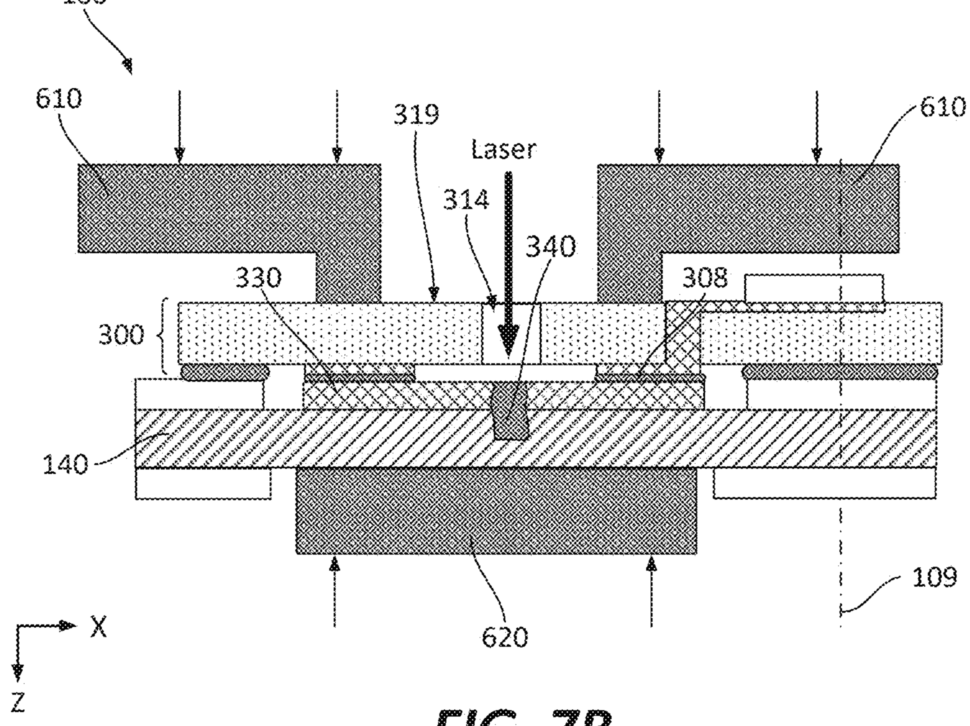
FIG. 7B is a schematic cross-sectional side view of a flexible circuit assembly, during welding, in which the conductive layer is pressed against the interconnecting structure by contact of the base with a first set of clamps, contact of the conductive layer with a second set of clamps, and advancing of the first set of clamps and the second set of clamps toward one another, in accordance with some examples.
Figure 7C:
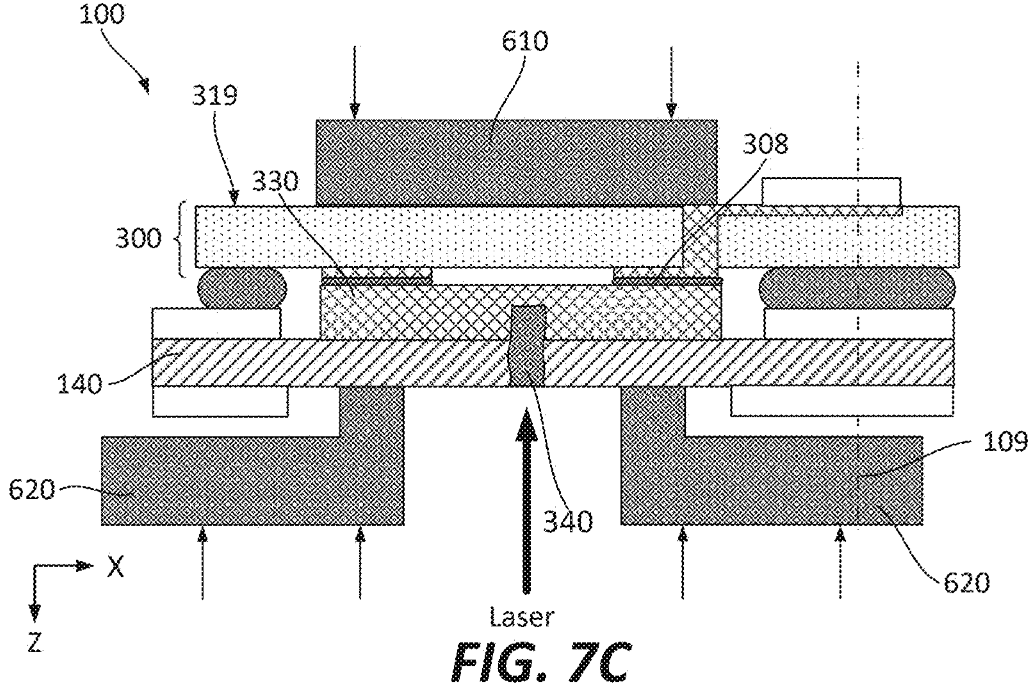
FIG. 7C is a schematic cross-sectional side view of a flexible circuit assembly, during welding, in which the conductive layer is pressed against the interconnecting structure by contact of the base with a first set of clamps, contact of the flexible circuit with a second set of clamps, and advancing of the first set of clamps and the second set of clamps toward one another, in accordance with some examples.

In some further examples, the first set of clamps 610 does not contact the interconnecting structure 330, and at least the base 320 is stacked between the first set of clamps 610 and the interconnecting structure 330. In some yet further examples, the first set of clamps 610 is positioned proximate to the component opening 314 without protruding into the component opening 314. FIG. 7A is a schematic cross-sectional side view of a flexible circuit assembly 100, during welding, in which the conductive layer 140 is pressed against the interconnecting structure 330 by contact of the base 320 with a first set of clamps 610, contact of the flexible circuit 105 with a second set of clamps 620, and advancing of the first set of clamps 610 and the second set of clamps 620 toward one another, in accordance with some examples. FIG. 7B is a schematic cross-sectional side view of a flexible circuit assembly 100, during welding, in which the conductive layer 140 is pressed against the interconnecting structure 330 by contact of the base 320 with a first set of clamps 610, contact of the conductive layer 140 with a second set of clamps 620, and advancing of the first set of clamps 610 and the second set of clamps 620 toward one another, in accordance with some examples. FIG. 7C is a schematic cross-sectional side view of a flexible circuit assembly 100, during welding, in which the conductive layer 140 is pressed against the interconnecting structure 330 by contact of the base 320 with a first set of clamps 610, contact of the flexible circuit 105 with a second set of clamps 620, and advancing of the first set of clamps 610 and the second set of clamps 620 toward one another, in accordance with some examples.

Method 400 further comprises (block 440) welding the conductive layer 140 against the interconnecting structure 330 through the component opening 314. It should be noted that the size of any burr 337 extending from a side of the interconnecting structure 330 facing either the electrical component 310 or the conductive layer 140 should be smaller than a maximum size in order to achieve good weld quality. The interconnecting structure 330 may comprise a burr 337 from, for example, manufacturing of the interconnecting structure 330. If the burr 337 is too large, the interconnecting structure 330 and the conductive layer 140 may not make suitable contact during the pressing, and the weld formed during the welding may comprise an undesirable air gap. FIG. 6C is a schematic cross-sectional side view of an interconnecting structure 330 comprising a burr 337, in accordance with some examples. The thickness of the interconnecting structure 330 along the stacking axis 109 is noted as $T_I$. The height of the burr 337 is noted as $H_B$. In some examples, $H_B$ is less than 20% of $T_I$, less than 10% of $T_I$, less than 5% of $T_I$, less than 3% of $T_I$, less than 1% of $T_I$, or even less than 0.5% of $T_I$.

The dimensions of the solder patch 308 may also affect weld quality. For example, the thicknesses of two solder patches 308 in the direction of the stacking axis 109 in FIG. 6C are indicated as $T_{S1}$ and $T_{S2}$. If the ratio of $T_{S1}$ and $T_{S2}$ is too small, the interconnecting structure 330 may not interface the conductive layer 140 evenly across the surface of the interconnecting structure 330 facing the conductive layer 140 during pressing. The interconnecting structure 330 may be bent during pressing, and the weld may comprise an undesirable air gap. In some examples, the ratio of $T_{S1}/(T_{S1}+T_{S2})$ is greater than 0.1, greater than 0.2, greater than 0.3, or even greater than 0.4. In some examples, the interconnecting structure 330 may be manufactured with an out-of-plane bend that is removed as the interconnecting structure 330 interfaces the conductive layer 140 during the pressing.

In other examples, the welding of the conductive layer 140 against the interconnecting structure 330 does not occur through a component opening 314, but rather by welding from a side of the conductive layer 140 opposite the interconnecting structure 330. For example, in FIG. 7C, the laser is applied to the surface of the conductive layer 140, and the weld plug 340 extends through the conductive layer 140 and protrudes into the interconnecting structure 330.

CONCLUSION

Although the foregoing concepts have been described in some detail for purposes of clarity of understanding, it will be apparent that certain changes and modifications may be practiced within the scope of the appended claims. It should be noted that there are many alternative ways of implementing processes, systems, and apparatuses. Accordingly, the present embodiments are to be considered illustrative and not restrictive.

The invention claimed is:

1. A flexible circuit assembly comprising: a flexible circuit comprising a first insulating layer, a conductive layer, and a second insulating layer, wherein: the conductive layer comprises aluminum and is stacked between the first insulating layer and the second insulating layer along a stacking axis, and the first insulating layer comprises a first-layer opening; and an electrical component subassembly comprising an electrical component and an interconnecting structure, wherein: the electrical component comprises a base, a contact pad comprising copper and stacked with the base, and a component opening, extending through each of the base and the contact pad, the component opening comprises a largest cross-sectional dimension, perpendicular to the stacking axis, fully overlapping with the interconnecting structure, the interconnecting structure is stacked between the contact pad and the conductive layer along the stacking axis and comprises one or more materials selected from the group consisting of nickel, brass, and copper, and the interconnecting structure is attached to the contact pad and is welded to the conductive layer by a weld plug such that the weld plug overlaps with the component opening, wherein the interconnecting structure comprises an interconnecting protrusion, the base comprises a connecting opening with the contact pad extending into the connecting opening, and the interconnecting protrusion is press-fit into the connecting opening directly interfacing and pressed against the contact pad within the connecting opening.

2. The flexible circuit assembly of claim 1, wherein the weld plug is formed by one or more of a laser weld, an ultrasonic weld, and a resistance weld.

3. The flexible circuit assembly of claim 1, wherein the interconnecting structure is attached to the contact pad using one or more of a solder patch, an additional weld plug, a press fit pin, and a screw-connector.

4. The flexible circuit assembly of claim 1, wherein the electrical component is selected from the group consisting of a printed circuit board, a surface mount electronic device, a voltage sensor, a voltage-sense harness, a negative thermal coefficient thermistor, a resistor, a capacitor, a diode, a transistor, an inductor, a transformer, an optoelectronic device, a sensor, a switch, an oscillator, an integrated circuit, another flexible interconnect circuit, and a power supply.

5. The flexible circuit assembly of claim 1, wherein:
the electrical component is a printed circuit board, and
the base comprises a glass-reinforced epoxy laminate material.

6. The flexible circuit assembly of claim 1, wherein the interconnecting structure has a uniform composition through an entire volume of the interconnecting structure.

7. The flexible circuit assembly of claim 1, wherein the interconnecting structure comprises a first surface and a second surface having a different composition than the first surface.

8. The flexible circuit assembly of claim 1, wherein the interconnecting structure is a clad.

9. The flexible circuit assembly of claim 1, wherein the interconnecting structure is substantially planar such that an out-of-plane deviation of the interconnecting structure, at least between the weld plug and one or more attachment points between the interconnecting structure and the contact pad, is less than 100 micrometers.

10. The flexible circuit assembly of claim 1, wherein the interconnecting structure is thinner than the conductive layer along the stacking axis.

11. The flexible circuit assembly of claim 1, wherein the interconnecting structure has a thickness of 50-200 micrometers.

12. The flexible circuit assembly of claim 1, wherein the conductive layer has a thickness of at least 300 micrometers.

13. The flexible circuit assembly of claim 1, wherein the weld plug terminates in the conductive layer to a surface of the conductive layer facing the second insulating layer.

14. The flexible circuit assembly of claim 1, wherein the electrical component subassembly further comprises a bonding layer, positioned between and bonding the electrical component and the first insulating layer.

15. The flexible circuit assembly of claim 1, wherein a portion of the interconnecting structure protrudes from between the electrical component and the flexible circuit.

16. The flexible circuit assembly of claim 1, wherein the flexible circuit further comprises an additional conductive layer stacked between the conductive layer and the second insulating layer along the stacking axis.

17. The flexible circuit assembly of claim 1, wherein:
the flexible circuit further comprises a third insulating layer and an electromagnetic shield stacked between the second insulating layer and the third insulating layer along the stacking axis, and
the second insulating layer is stacked between the conductive layer and the electromagnetic shield along the stacking axis.

18. A method of fabricating a flexible circuit assembly comprising a stacking axis, the method comprising:
providing an electrical component subassembly comprising an electrical component and an interconnecting structure, wherein:
the electrical component comprises a base, a contact pad comprising copper and stacked with the base, and a component opening, extending through each of the base and the contact pad,
the component opening comprises a largest cross-sectional dimension, perpendicular to the stacking axis, fully overlapping with the interconnecting structure, and
the interconnecting structure is soldered to the contact pad by a solder patch and comprises one or more materials selected from the group consisting of nickel, brass, and copper;
aligning a flexible circuit with the electrical component subassembly, wherein:
the flexible circuit comprises a first insulating layer, a conductive layer, and a second insulating layer,
the conductive layer comprises aluminum and is stacked between the first insulating layer and the second insulating layer along a stacking axis, and
the first insulating layer comprises a first-layer opening;
pressing the conductive layer against the interconnecting structure, wherein:
the interconnecting structure is stacked between the contact pad and the conductive layer along the stacking axis, and
at least a portion of the interconnecting structure, which is aligned with the electrical component, directly interfaces the conductive layer; and
welding the conductive layer against the interconnecting structure through the component opening.

19. The method of claim 18, wherein pressing the conductive layer against the interconnecting structure comprises:

contacting the base with a first set of clamps, contacting the flexible circuit with a second set of clamps, and advancing the first set of clamps and the second set of clamps toward one another.

* * * * *